United States Patent
Lin et al.

(10) Patent No.: US 11,797,746 B2
(45) Date of Patent: Oct. 24, 2023

(54) METHOD OF FORMING SEMICONDUCTOR DEVICE HAVING MORE SIMILAR CELL DENSITIES IN ALTERNATING ROWS

(71) Applicant: TAIWAN SEMICONDUCTOR MANUFACTURING COMPANY, LTD., Hsinchu (TW)

(72) Inventors: Wei-Cheng Lin, Hsinchu (TW); Hui-Ting Yang, Hsinchu (TW); Jiann-Tyng Tzeng, Hsinchu (TW); Lipen Yuan, Hsinchu (TW); Wei-An Lai, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/865,272

(22) Filed: Jul. 14, 2022

(65) Prior Publication Data
US 2022/0374577 A1    Nov. 24, 2022

Related U.S. Application Data

(63) Continuation of application No. 17/131,128, filed on Dec. 22, 2020, now Pat. No. 11,409,937, which is a
(Continued)

(51) Int. Cl.
| H01L 27/02 | (2006.01) |
| G06F 30/392 | (2020.01) |
| G06F 30/398 | (2020.01) |

(52) U.S. Cl.
CPC .......... *G06F 30/392* (2020.01); *G06F 30/398* (2020.01); *H01L 27/0207* (2013.01)

(58) Field of Classification Search
CPC .................... G06F 30/392; H01L 27/0207
See application file for complete search history.

(56) References Cited

U.S. PATENT DOCUMENTS

| T100,501 I4 | 4/1981 | Balyoz et al. |
| 4,623,911 A | 11/1986 | Pryor |
(Continued)

FOREIGN PATENT DOCUMENTS

| CN | 102208359 | 10/2011 |
| CN | 104347634 | 2/2015 |
(Continued)

OTHER PUBLICATIONS

Notice of Allowance dated Mar. 25, 2020 from corresponding application No. TW 108125135.
(Continued)

*Primary Examiner* — Thao P Le
(74) *Attorney, Agent, or Firm* — Hauptman Ham, LLP

(57) ABSTRACT

A method (of forming a semiconductor device) including forming cell regions (in alternating first and second rows having first and second heights) including forming a majority of the cell regions in the first rows including: limiting a height of the majority of the cell regions to be single-row cell regions that span corresponding single one of the first rows but do not extend therebeyond; and forming a minority of the cell regions correspondingly in at least the first rows including reducing widths of the multi-row cell regions to be smaller than comparable single-row cell regions; and expanding heights of the minority of the cell regions to be multi-row cell regions, each of the multi-row cell regions spanning a corresponding single first row and at least a corresponding second row such that cell region densities of the second rows are at least about forty percent.

20 Claims, 27 Drawing Sheets

Related U.S. Application Data continuation of application No. 16/502,869, filed on Jul. 3, 2019, now Pat. No. 10,878,158.

(60) Provisional application No. 62/698,464, filed on Jul. 16, 2018.

(56) References Cited

U.S. PATENT DOCUMENTS

| | | | |
|---|---|---|---|
| 6,242,767 | B1 | 6/2001 | How et al. |
| 6,445,049 | B1 | 9/2002 | Iranmanesh |
| 7,129,562 | B1 | 10/2006 | Gheewala et al. |
| 7,260,442 | B2 | 8/2007 | Hwang et al. |
| 9,256,709 | B2 | 2/2016 | Yu et al. |
| 11,270,057 | B1 | 3/2022 | Yang et al. |
| 2005/0226068 | A1 | 10/2005 | Brandon et al. |
| 2014/0040838 | A1 | 2/2014 | Liu et al. |
| 2014/0103494 | A1 | 4/2014 | Peng et al. |
| 2015/0278429 | A1 | 10/2015 | Chang |
| 2018/0337167 | A1 | 11/2018 | Lin et al. |
| 2019/0164962 | A1 | 5/2019 | Sio et al. |
| 2020/0006481 | A1* | 1/2020 | Yang ............ H01L 29/66545 |
| 2020/0019667 | A1 | 1/2020 | Lin et al. |
| 2020/0074039 | A1 | 3/2020 | Lu et al. |
| 2020/0104445 | A1 | 4/2020 | Peng et al. |
| 2020/0134128 | A1 | 4/2020 | Peng et al. |
| 2021/0192118 | A1 | 6/2021 | Lei et al. |
| 2021/0224457 | A1* | 7/2021 | Guo ..................... H01L 23/50 |
| 2021/0272605 | A1* | 9/2021 | Peng ............... H01L 23/5386 |
| 2021/0305151 | A1* | 9/2021 | Sakai ............... H01L 23/5226 |
| 2021/0343744 | A1 | 11/2021 | Chiu et al. |
| 2021/0358849 | A1 | 11/2021 | Chen |
| 2021/0375851 | A1 | 12/2021 | Peng et al. |
| 2022/0067259 | A1 | 3/2022 | Wang et al. |
| 2022/0068816 | A1 | 3/2022 | Yang et al. |
| 2022/0139952 | A1* | 5/2022 | Kim ..................... H10B 41/27 257/314 |
| 2022/0367511 | A1* | 11/2022 | Hwang ............ H01L 23/5226 |
| 2023/0053710 | A1* | 2/2023 | Lai ......................... G05F 1/56 |

FOREIGN PATENT DOCUMENTS

| | | |
|---|---|---|
| KR | 20180061079 | 6/2018 |
| TW | 200415757 | 8/2004 |
| TW | 201624537 | 7/2016 |

OTHER PUBLICATIONS

Notice of Allowance dated Dec. 30, 2020 for corresponding case No. KR 10-2019-0085889.

* cited by examiner

METHOD OF FORMING SEMICONDUCTOR DEVICE HAVING MORE SIMILAR CELL DENSITIES IN ALTERNATING ROWS

PRIORITY CLAIM AND CROSS-REFERENCE

The present application is a continuation application of U.S. patent application Ser. No. 17/131,128, filed Dec. 22, 2020, now U.S. Pat. No. 11,409,937, issued Aug. 9, 2022, which is a continuation application of U.S. patent application Ser. No. 16/502,869, filed Jul. 3, 2019, now U.S. Pat. No. 10,878,158, issued on Dec. 29, 2020, which claims the priority of U.S. Provisional Application No. 62/698,464, filed Jul. 16, 2018, which are incorporated herein by reference in their entireties.

BACKGROUND

An integrated circuit ("IC") includes one or more semiconductor devices. One way in which to represent a semiconductor device is with a plan view diagram referred to as a layout diagram. Layout diagrams are generated in a context of design rules. A set of design rules imposes constraints on the placement of corresponding patterns in a layout diagram, e.g., geographic/spatial restrictions, connectivity restrictions, or the like. Often, a set of design rules includes a subset of design rules pertaining to the spacing and other interactions between patterns in adjacent or abutting cells where the patterns represent conductors in a layer of metallization.

Typically, a set of design rules is specific to a process technology node by which will be fabricated a semiconductor device based on a layout diagram. The design rule set compensates for variability of the corresponding process technology node. Such compensation increases the likelihood that an actual semiconductor device resulting from a layout diagram will be an acceptable counterpart to the virtual device on which the layout diagram is based.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
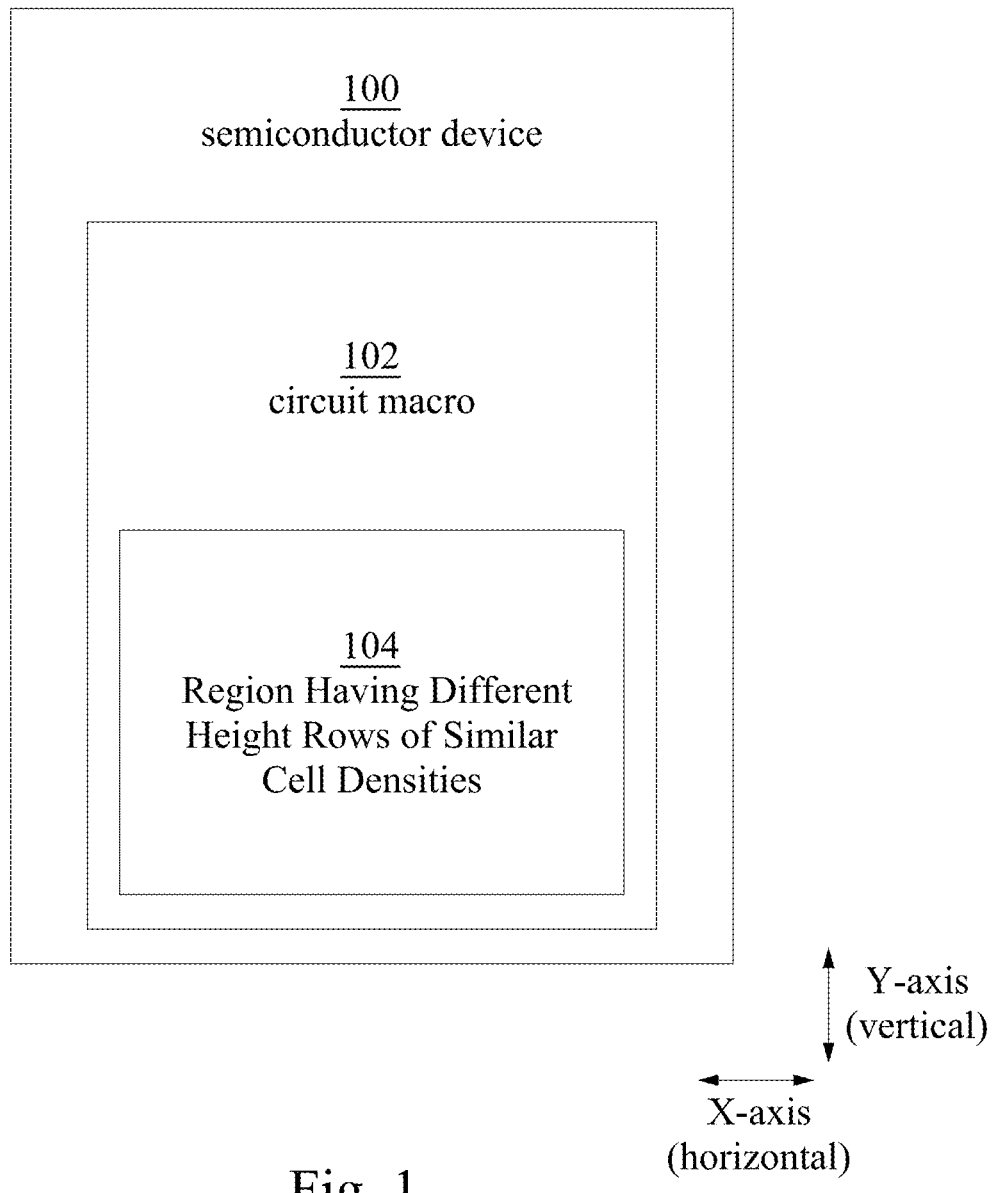
FIG. 1 is a block diagram of a semiconductor device, in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

According to another approach, a layout diagram arranged in alternating first and second rows, where the first rows have a first height and the second rows have a second height different than the first height. In some areas of the layout diagram according to the other approach, an average cell density of the first rows is greater than an average cell density of the second rows, which leaves substantial amounts of empty (and underutilized) space in the second rows.

According to at least some embodiments, in a layout diagram arranged in alternating first and second rows, where the first rows have a first height and the second rows have a second height different than the first height, a first area is identified in which an initial average cell density of the first rows is greater than an initial average cell density of the second rows. To reduce the substantial amounts of empty (and underutilized) space in the second rows, first cells in the first rows are substituted with corresponding second cells which: reduces cell densities correspondingly in one or more of the first rows; increases cell densities correspondingly in one or more of the second rows; and thereby, in effect, increase a net cell density of the first and second rows. The second cells are multi-row-height cells which are narrower than the corresponding first cells being substituted therefor.

FIG. 1 is a block diagram of a semiconductor device 100 in accordance with at least one embodiment of the present disclosure.

In FIG. 1, semiconductor device 100 includes, among other things, a circuit macro (hereinafter, macro) 102. In some embodiments, macro 102 is an SRAM macro. In some embodiments, macro 102 is a macro other than an SRAM macro. Macro 102 includes, among other things, a region having rows of different heights, where the rows having similar cell densities. Examples of layout diagrams resulting in cell region 104 include the layout diagrams disclosed herein.

Figure 2A:
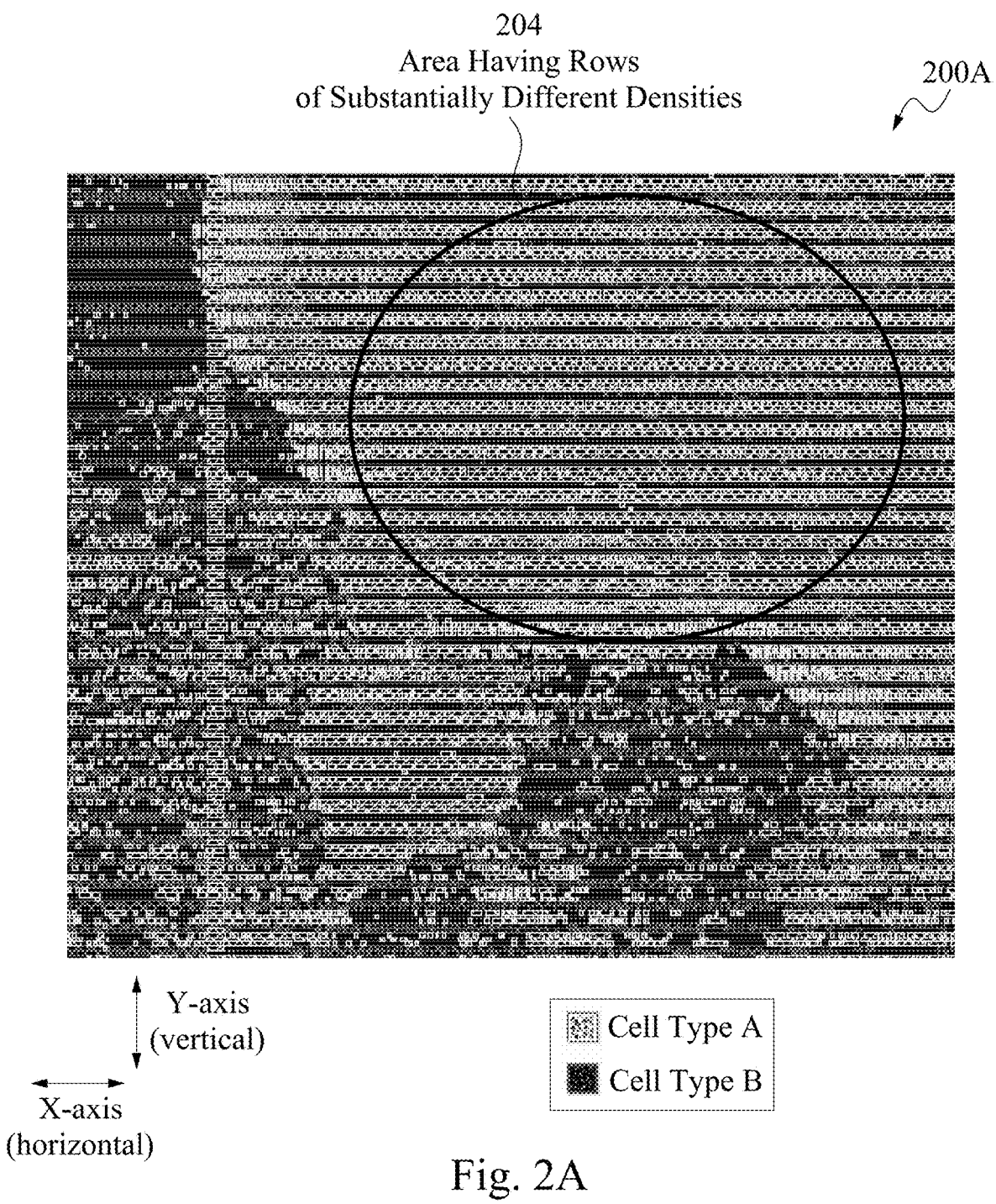
FIGS. 2A-2G are corresponding layout diagrams, in accordance with some embodiments.

FIG. 2A is a layout diagram 200A for a corresponding semiconductor device, in accordance with at least one embodiment of the present disclosure.

Layout diagram 200A represents an initial layout diagram which is refined according to one or more of the methods of generating a layout diagram disclosed herein.

An example of a semiconductor device having been fabricated based on a larger layout diagram which includes a refined version of layout diagram 200A (resulting from one or more of the refinement methods disclosed herein) is semiconductor device 100 of FIG. 1.

Layout diagram 200A is arranged in rows (see FIGS. 2B-2C, 2E or the like) arranged in alternating first and second rows. The first and second rows extend in a first direction. Relative to a second direction, the first rows have a first size (height) and the second rows have a second height shorter than the first height, where the second direction is substantially perpendicular to the first direction. In FIG. 2A, the first direction is the horizontal direction and the second direction is the vertical direction. In some embodiments, the first and second directions are directions other than the corresponding horizontal and vertical directions.

Area 204 is an area in which the cell densities of the first rows are substantially different than the cell densities of the second rows. In some embodiments, an initial average cell density of the first rows is greater than an initial average cell density of the second rows.

Figure 2B:
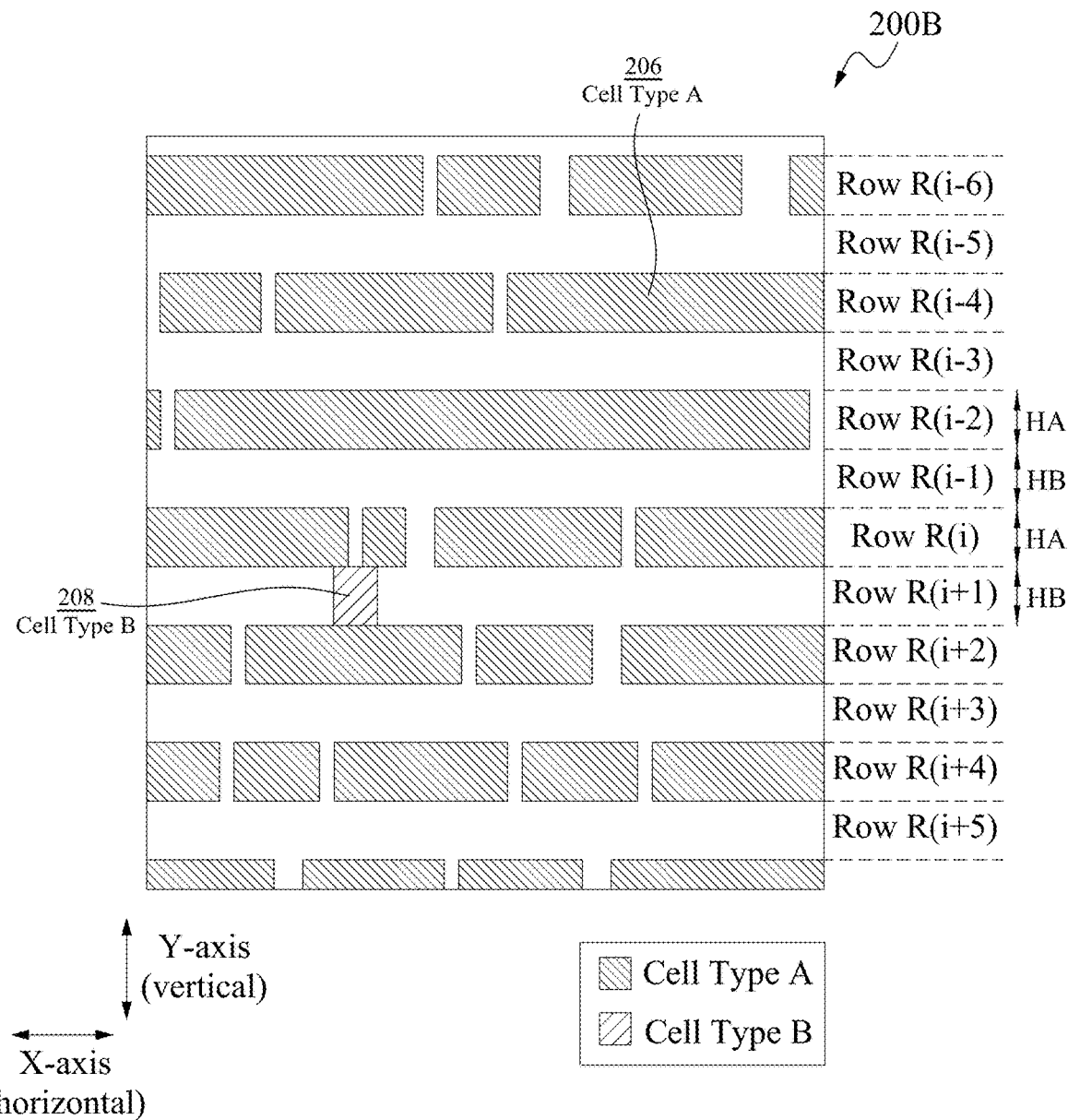

FIG. 2B is a layout diagram 200B for a corresponding semiconductor device, in accordance with at least one embodiment of the present disclosure.

Layout diagram 200B is a zoomed-in view of a sub-area within area 204 of FIG. 2A. The first rows of FIG. 2A correspond to rows R(i−4), R(i−2), R(i), R(i+2) and R(i+4) in FIG. 2B, where i is a non-negative integer. The second rows of FIG. 2A correspond to rows R(i−3), R(i−1), R(i+1), R(i+3) and R(i+5) in FIG. 2B. The first rows have the first height, which is HA in FIG. 2B. The second rows have the second height, which is HB in FIG. 2B, and where HB<HA.

In FIG. 2B, each of first rows R(i−4), R(i−2), R(i), R(i+2) and R(i+4) is substantially occupied by (filled with) cells 206 of a type A. Each type A cell 206 has height HA. An empty space in a row is a space not occupied by a cell. Few empty spaces are present in each of first rows R(i−4), R(i−2), R(i), R(i+2) and R(i+4).

In FIG. 2B, each of second rows R(i−3), R(i−1), R(i+3) and R(i+5) is devoid of cells, and second row R(i+1) includes only one cell 208 of type B. Each type B cell 208 has height HB.

Accordingly, first rows R(i−4), R(i−2), R(i), R(i+2) and R(i+4) have relatively high cell densities, and second rows R(i−3), R(i−1), R(i+1), R(i+3) and R(i+5) have relatively low densities. An initial average cell density of first rows R(i−4), R(i−2), R(i), R(i+2) and R(i+4) is greater than an initial average cell density of second rows R(i−3), R(i−1), R(i+1), R(i+3) and R(i+5).

Using one or more of the refinement methods disclosed herein (and discussed below), layout diagram 200B is refined so as to substitute cells 206 of type A with corresponding multi-row-height cells which: reduces cell densities correspondingly corresponding ones of first rows R(i−4), R(i−2), R(i), R(i+2) and R(i+4); increases cell densities correspondingly in corresponding ones of second rows R(i−3), R(i−1), R(i+1), R(i+3) and R(i+5); and thereby, in effect, increases a net cell density of first rows R(i−4), R(i−2), R(i), R(i+2) and R(i+4) and second rows R(i−3), R(i−1), R(i+1), R(i+3) and R(i+5).

Figure 2C:
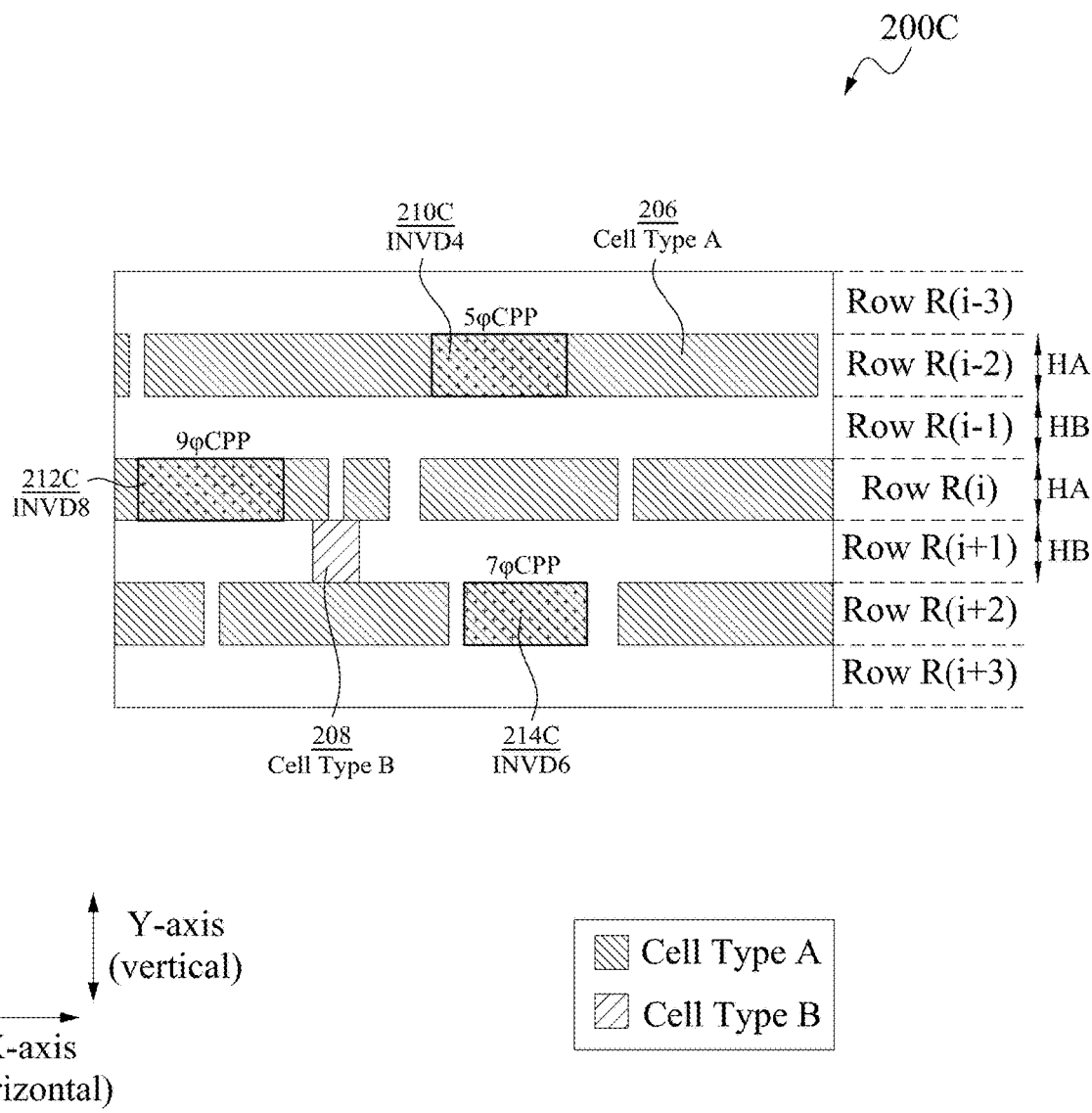

FIG. 2C is a layout diagram 200C for a corresponding semiconductor device, in accordance with at least one embodiment of the present disclosure.

Layout diagram 200C is a further zoomed-in view of a sub-area within area 204 of layout diagram 200B of FIG. 2B. Layout diagram 200C is similar to layout diagram 200B. For brevity, the discussion will focus more on differences between layout diagram 200C and layout diagram 200B than on similarities.

To help describe one or more of the refinement methods disclosed herein, particular examples of cells 206 of type A shown in FIG. 2C are substituted with corresponding example multi-row-height inverter cells in FIG. 2D (discussed below).

For purposes of discussion, layout diagram 200C shows examples of some of cells 206 of type A in more detail. Layout diagram 200C includes an inverter cell 210C located in first row R(i−2), an inverter cell 212C located in first row R(i) and an inverter cell 214C located in first row R(i+2). Because each of inverter cells 210C, 212C and 214C is an example of type A cell 206, accordingly each of inverter cells 210C, 212C and 214C has height HA.

Inverter cell 210C is an INVD4 type of inverter cell. In some embodiments, the term INVD4 is an abbreviation of the phrase 'inverter cell having D4 current driving capacity/capability,' where D4=4*D1, and where D1 is a unit of current driving capacity/capability for corresponding transistor in a semiconductor device produced by a process technology node associated with layout diagrams such as layout diagram 200C which include inverter cell 210C. Inverter cell 212C is an INVD8 type of inverter cell, where D8 is greater than D4 such that inverter cell 212C represents an inverter cell which has greater current driving capacity/capability than (namely, twice as much as) an inverter represented by inverter cell 210C. Inverter cell 214C is an INVD6 type of inverter cell, where D6 is greater than D4 but less than D8 such that inverter cell 214C represents an inverter which has greater current driving capacity/capability (namely, 1.5× more) than an inverter represented by inverter cell 210C, and which has lesser current driving capacity/capability (namely, 25% less) than an inverter represented by inverter cell 212C.

Regarding the examples of layout diagram 200C, inverter cell 210C has a size in the first direction (width), which is the horizontal direction in FIG. 2C, of $5\varphi CPP=5*\varphi*CPP$. Inverter cell 212C has a width of $9\varphi CPP$. Inverter cell 214C has a width of $7\varphi CPP$. Accordingly, inverter cell 214C is wider than inverter cell 210C, and inverter cell 212C is wider than inverter cell 214C. In some embodiments, CPP is an abbreviation of the term 'contact poly pitch.' In some embodiments, CPP is the minimum distance between gate patterns corresponding to gate electrodes in a semiconductor device produced by a process technology node associated with layout diagrams such as layout diagram 200C. In some embodiments, $\varphi$ (the lowercase Greek letter 'phi') is a positive number and a multiplier available in a standard cell library of a process technology node associated with layout diagrams such as layout diagram 200C. In some embodiments, $\varphi$ is a positive integer. In some embodiments, $\varphi=1$.

Regarding FIG. 2C, in some embodiments, at least some of the other ones of cells 206 of type A have a Boolean function (not shown), of which there are many varieties, other than that of inversion as in inverter cells 210C, 212C and 214C. In some embodiments, at least some of the other ones of cells 206 of type A have a storage function. The refinement methods disclosed herein are suitable for substituting ones of cells 206 of type A which have Boolean functions other than the Boolean inversion function as in inverter cells 210C, 212C and 214C.

Figure 2D:
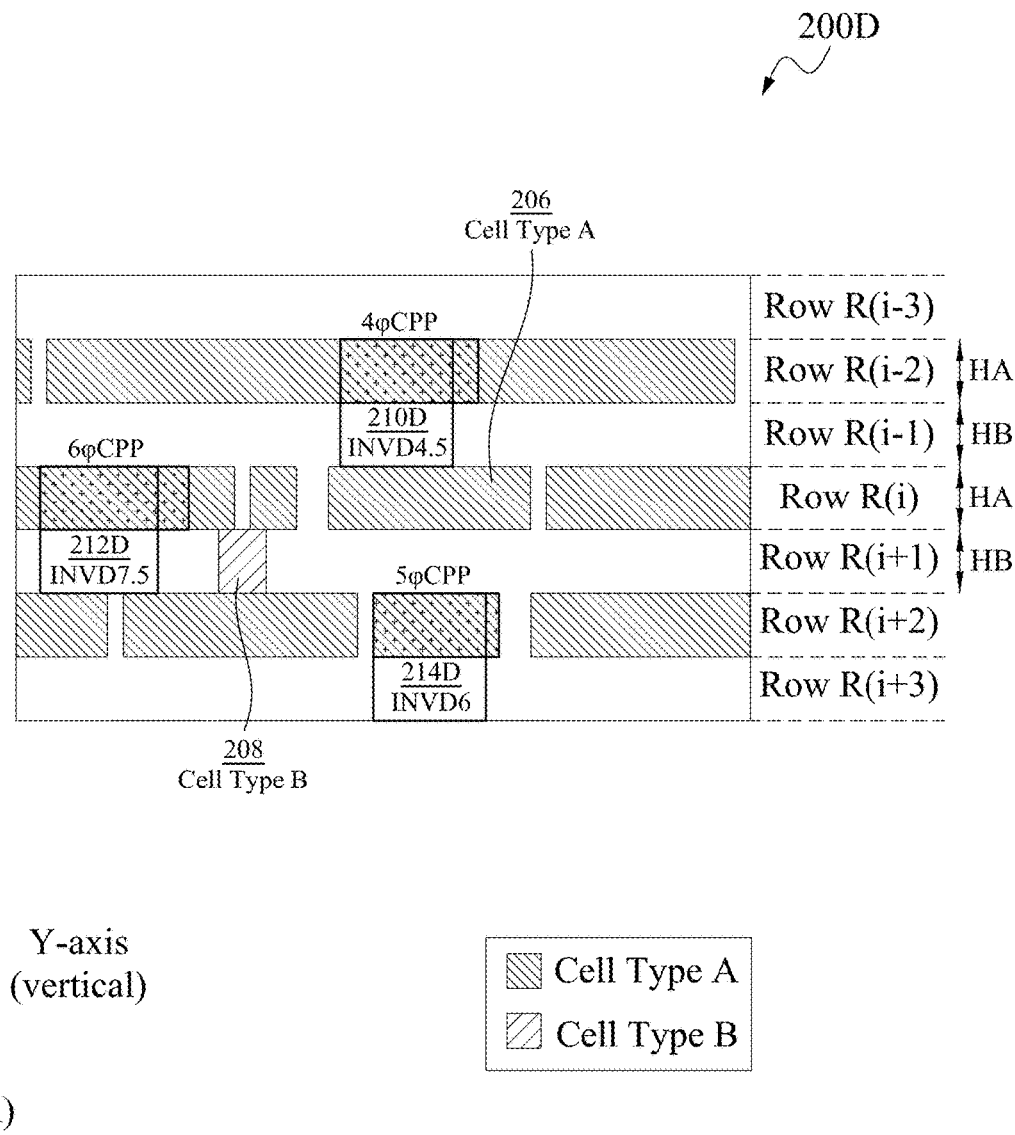

FIG. 2D is a layout diagram 200D for a corresponding semiconductor device, in accordance with at least one embodiment of the present disclosure.

Layout diagram 200D is similar to layout diagram 200B. For brevity, the discussion will focus more on differences between layout diagram 200D and layout diagram 200B than on similarities. Elements of layout diagram 200D which are similar to elements of layout diagram 200C have suffix-D-series numbers which track corresponding suffix-C-series numbers in layout diagram 200C, e.g., substitute inverter cell 210D in layout diagram 200D for inverter cell 210C in layout diagram 200C.

To help describe one or more of the refinement methods disclosed herein, examples of multi-row-height cells are shown in FIG. 2D as substituting for the corresponding examples of cells 206 of type A shown in FIG. 2C.

In layout diagram 200D, inverter cells 210D, 212D and 214D are shown as substitutes for corresponding inverter cells 210C, 212C and 214C of FIG. 2C. Whereas each of inverter cells 210C, 212C and 214C in FIG. 2C is a single-row-height cell of height HA, each of inverter cells 210D, 212D and 214D in FIG. 2D is a multi-row-height cell, as discussed below.

In layout diagram 200D, inverter cell 210D is located in rows R(i−2) and R(i−1), which have corresponding heights HA and HB. Accordingly, inverter cell 210D has a height HC, where HC=HA+HB. Inverter cell 212D is located in rows R(i) and R(i+1) which have corresponding heights HA and HB, resulting in inverter cell 212D having height HC=HA+HB. Inverter cell 214D is located in rows R(i+2) and R(i+3) which have corresponding heights HA and HB, resulting in inverter cell 214D having height HC=HA+HB.

Inverter cell 210D is an INVD4.5 type of inverter cell having a width of 4*φ*CPP. Inverter cell 212D is an INVD7.5 type of inverter cell having a width of 6*φ*CPP. Inverter cell 214D is an INVD6 type of inverter cell having a width of 5*φ*CPP.

Regarding cell 210D of FIG. 2D, as compared to corresponding inverter cell 210C of FIG. 2C which is INVD4 with a height of HA and a width of 5*φ*CPP, inverter cell 210D which is INVD4.5 is substituted with a height of HC=HA+HB and a width of 4*φ*CPP. Accordingly, inverter cell 210D has about 12.5% greater current driving capacity/capability than inverter cell 210C, while being taller and narrower. By being taller than inverter cell 210C, inverter cell 210D uses otherwise empty space in row R(i−1) under the location of inverter cell 210C in row R(i−2), which increases the cell density in row R(i−1). By being narrower than inverter cell 210C by an increment of 1φCPP, inverter cell 210D uses about 20% less space in row R(i−2) than otherwise used by inverter cell 210C, which reduces the cell density of row R(i−2). By being both taller and narrower than inverter cell 210C, the substitution of inverter cell 210D for inverter cell 210C increases a net cell density of rows R(i−2) and R(i−1) while having greater current driving capacity/capability than inverter cell 210C.

Regarding cell 212D of FIG. 2D, as compared to inverter cell 212C of FIG. 2C which is INVD8 with a height of HA and a width of 9φCPP, inverter cell 212D which is INVD7.5 is substituted with a height of HC=HA+HB and a width of 6*φ*CPP. Accordingly, inverter cell 212D has nearly the same (about 94%) current driving capacity/capability as inverter cell 212C, while being taller and narrower. By being taller than inverter cell 212C, inverter cell 212D uses otherwise empty space under in row R(i+1) under the location of inverter cell 212C in row R(i), which increases the cell density in row R(i+1). By being narrower than inverter cell 212C by an increment of 3φCPP, inverter cell 212D uses less space (about 33% less space) in row R(i) than otherwise used by inverter cell 212C, which reduces the cell density of row R(i). By being both taller and narrower than inverter cell 212C, the substitution of inverter cell 212D for inverter cell 212C increases a net cell density of rows R(i) and R(i+1) while having nearly the same current driving capacity/capability as inverter cell 212C.

Regarding cell 214D of FIG. 2D, as compared to inverter cell 214C of FIG. 2C which is INVD6 with a height of HA and a width of 7φCPP, substitute inverter cell 214D is INVD6 with a height of HC=HA+HB and a width of 5*φ*CPP. Accordingly, inverter cell 214D has the same current driving capacity/capability as inverter cell 214C, while being taller and narrower. By being taller than inverter cell 214C, inverter cell 214D uses otherwise empty space under in row R(i+3) under the location of inverter cell 214C in row R(i+2), which increases the cell density in row R(i+3). By being narrower than inverter cell 214C by an increment of 2φCPP, inverter cell 214D uses about 29% less space in row R(i+2) than otherwise used by inverter cell 214C, which reduces the cell density of row R(i+2). By being both taller and narrower than inverter cell 214C, the substitution of inverter cell 214D for inverter cell 214C increases a net cell density of rows R(i+2) and R(i+3) while having the same current driving capacity/capability as inverter cell 214C.

Figure 2E:
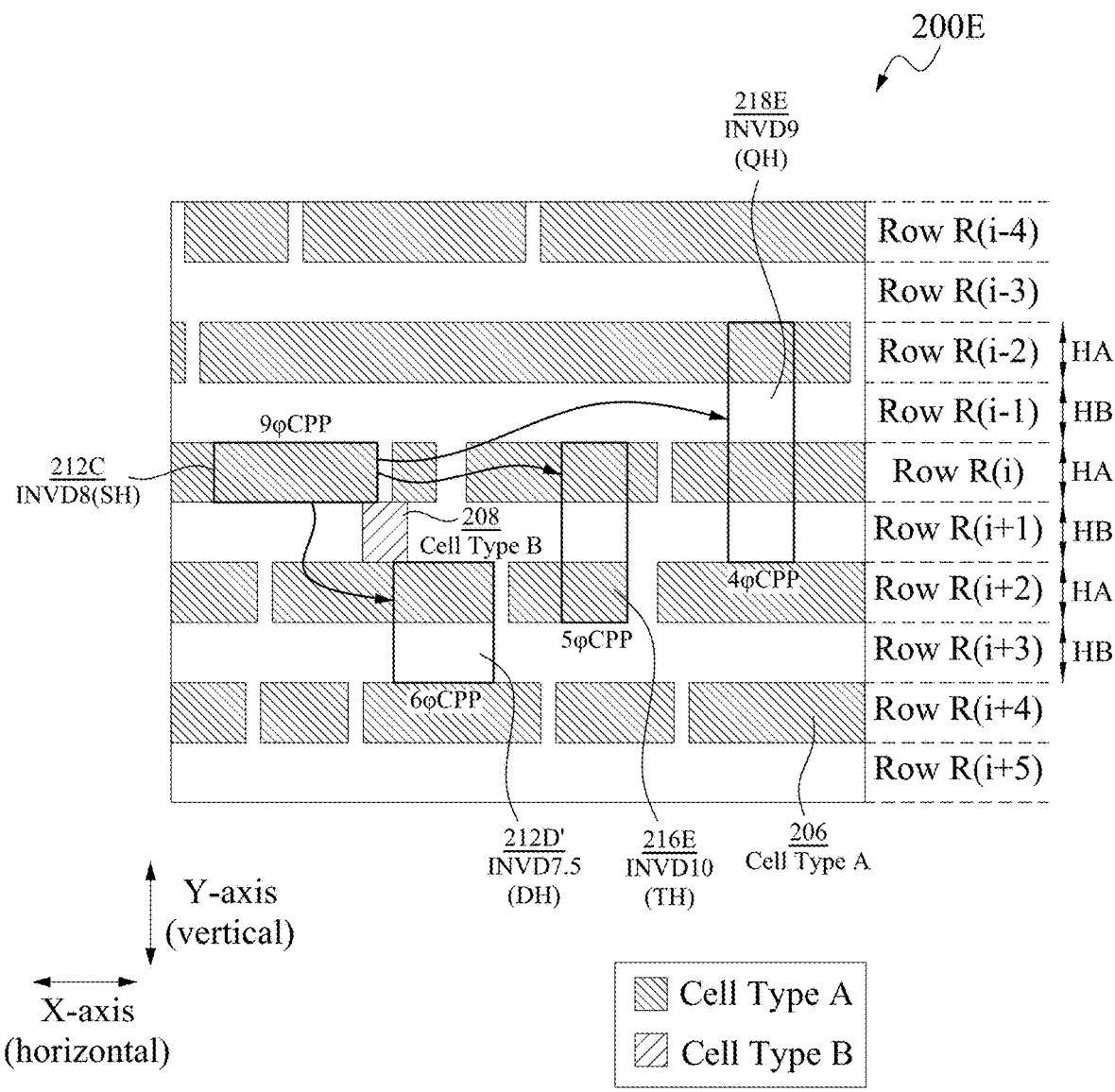

FIG. 2E is a layout diagram 200E for a corresponding semiconductor device, in accordance with at least one embodiment of the present disclosure.

Layout diagram 200E is a further zoomed-in view of a sub-area within area 204 of layout diagram 200B of FIG. 2B. Layout diagram 200E is similar to layout diagram 200B. For brevity, the discussion will focus more on differences between layout diagram 200E and layout diagram 200B than on similarities.

To help describe one or more of the refinement methods disclosed herein, examples of multi-row-height cells are shown in FIG. 2D as being substitutes for an example of cells 206 of type A shown in FIG. 2C, namely inverter 212C. Inverter cell 212D of FIG. 2D corresponds to inverter cell 212C of FIG. 2C.

More particularly, in layout diagram 200E, inverter cells 212D', 216E and 218E are shown as substitutes for inverter cell 212C. Whereas inverter cell 212C is a single-row-height cell of height HA, each of inverter cells 212D', 216E and 218E in FIG. 2E is a multi-row-height cell, as discussed below. For simplicity of illustration, each of inverter cells 212D', 216E and 218E is shown in a different corresponding location than inverter cell 212C because otherwise each of inverter cells 212D', 216E and 218E would be superimposed on inverter cell 212C. In some embodiments, for a given one of inverter cells 212D', 216E and 218E which is selected to replace inverter cell 212C, the given one would partially overlap the location in row R(i) otherwise occupied by inverter cell 212C, which is referred to as a partial overlap scenario. The given one would partially overlap in a sense that a first portion of the given one would occupy a second portion of the location in row R(i) otherwise occupied by inverter cell 212C. In some embodiments, for a given one of inverter cells 212D', 216E and 218E which is selected to replace inverter cell 212C, the given one is disposed in a location which does not partially overlap the location in row R(i) otherwise occupied by inverter cell 212C, e.g., as shown in FIG. 2E.

In layout diagram 200E, inverter cell 212D' corresponds to inverter cell 212D of FIG. 2D but inverter cell 212D' is disposed in a different location in FIG. 2E as compared to inverter cell 212D in FIG. 2D. Inverter cell 212D' is located in rows R(i+2) and R(i+3) which have corresponding heights HA and HB, resulting in inverter cell 212D' having height HC=HA+HB. In some embodiments, a cell having height HC is referred to as a double height (DH) cell. Inverter cell 216E is located in rows R(i), R(i+1) and R(i+2) which have corresponding heights HA, HB and HA, resulting in inverter cell 216E having height HD=HA+HB+HA. In some embodiments, a cell having height HD is referred to as a triple height (TH) cell. Inverter cell 218E is located in rows R(i−2), R(i−1), R(i) and R(i+1) which have corresponding heights HA, HB, HA and HB, resulting in inverter cell 218E having height HE=HA+HB+HA+HB. In some embodiments, a cell having height HE is referred to as a quadruple height (QH) cell.

Inverter cell 212D' is an INVD7.5 type of inverter cell having a width of $6*\varphi*CPP$. Inverter cell 216E is an INVD10 type of inverter cell having a width of $5*\varphi*CPP$. Inverter cell 218E is an INVD9 type of inverter cell having a width of $4*\varphi*CPP$.

Regarding cell 212D' of FIG. 2E, as compared to inverter cell 212C of FIG. 2E which is INVD8 with a height of HA and a width of $9\varphi CPP$, inverter cell 212D' which is INVD7.5 is substituted with a taller height of HC=HA+HB and a narrower width of $6*\varphi*CPP$. Inverter cell 212D' has nearly the same (about 94%) current driving capacity/capability as inverter cell 212C, while being taller and narrower. By being taller than inverter cell 212C, inverter cell 212D' uses otherwise empty space under inverter cell 212C in row R(i+3), which increases the cell density in row R(i+3). By being narrower than inverter cell 212C, inverter cell 212D' uses less space (about 33% less space) in row R(i+2) than otherwise would be used by inverter cell 212C in row R(i+2), which reduces the cell density of row R(i+2). By being both taller and narrower than inverter cell 212C, the substitution of inverter cell 212D' for inverter cell 212C increases a net cell density of rows R(i+2) and R(i+3) while having nearly the same current driving capacity/capability as inverter cell 212C. In a partial overlap scenario (discussed above), by being taller than inverter cell 212C, inverter cell 212D' uses otherwise empty space under inverter cell 212C in row R(i+1), which increases the cell density in row R(i+1). In the partial overlap scenario, by being narrower than inverter cell 212C, inverter cell 212D' uses less space (about 33% less space) in row R(i) than otherwise would be used by inverter cell 212C in row R(i), which reduces the cell density of row R(i).

Regarding cell 216E of FIG. 2E, as compared to corresponding inverter cell 212C of FIG. 2E which (again) is INVD8 with a height of HA and a width of $9\varphi CPP$, inverter cell 216 E which is INVD10 is substituted with a taller height of HD=HA+HB+HA and a narrower width of $5*\varphi*CPP$. Accordingly, inverter cell 216E has about 25% greater current driving capacity/capability than inverter cell 212C, while being taller and narrower. By being taller than inverter cell 212C, inverter cell 216E uses otherwise empty space in row R(i+1) under the new location in row R(i) for inverter cell 216E, which increases the cell density in row R(i+1). Also by being taller than inverter cell 212C, inverter cell 216E displaces at least a portion of a cell otherwise located in row R(i+2) under the new location in row R(i) for inverter cell 216E, which typically has little if any effect on the aggregate cell density of rows R(i) and R(i+2).

By being narrower than inverter cell 210C by an increment of $4\varphi CPP$, inverter cell 216E uses about 44% less space in row R(i) than otherwise would be used by inverter cell 210C in row R(i), which reduces the cell density of row R(i). By being both taller and narrower than inverter cell 210C, the substitution of inverter cell 216E for inverter cell 210C increases a net cell density of rows R(i) and R(i+2) while having greater current driving capacity/capability than inverter cell 210C.

Regarding cell 218E of FIG. 2E, as compared to inverter cell 212C of FIG. 2E which (again) is INVD8 with a height of HA and a width of $9*\varphi*CPP$, inverter cell 218E which is INVD9 is substituted with a taller height of HD=HA+HB+HA+HB and a narrower width of $4*\varphi*CPP$. Accordingly, inverter cell 218E has about 12.5% greater current driving capacity/capability than inverter cell 212C, while being taller and narrower. By being taller than inverter cell 212C, inverter cell 218E uses otherwise empty space in rows R(i−1) and R(i+1) correspondingly over and under the new location for inverter cell 218E in row R(i), which increases the corresponding cell densities in rows R(i−1) and R(i+1). Also by being taller than inverter cell 212C, inverter cell 218E displaces at least a portion of a cell otherwise located in row R(i−2) over the new location in row R(i) for inverter cell 218E, which typically has little if any effect on the aggregate cell density of rows R(i−2) and R(i). By being narrower than inverter cell 212C by an increment of $5\varphi CPP$, inverter cell 218E uses about 56% less space in row R(i) than otherwise would be used by inverter cell 212C, which reduces the cell density of row R(i). By being both taller and narrower than inverter cell 212C, the substitution of inverter cell 218E for inverter cell 212C increases a net cell density of rows R(i−2), R(i−1), R(i) and R(i+1) while having greater current driving capacity/capability than inverter cell 212C.

Regarding FIG. 2E, in some embodiments, at least some of the other ones of cells 206 of type A have a Boolean function (not shown), of which there are many varieties, other than that of inversion as in inverter cell 212C. In some embodiments, at least some of the other ones of cells 206 of type A have a storage function. The refinement methods disclosed herein are suitable for substituting ones of cells 206 of type A which have Boolean functions other than the Boolean inversion function as in inverter cell 212C.

Figure 2F:
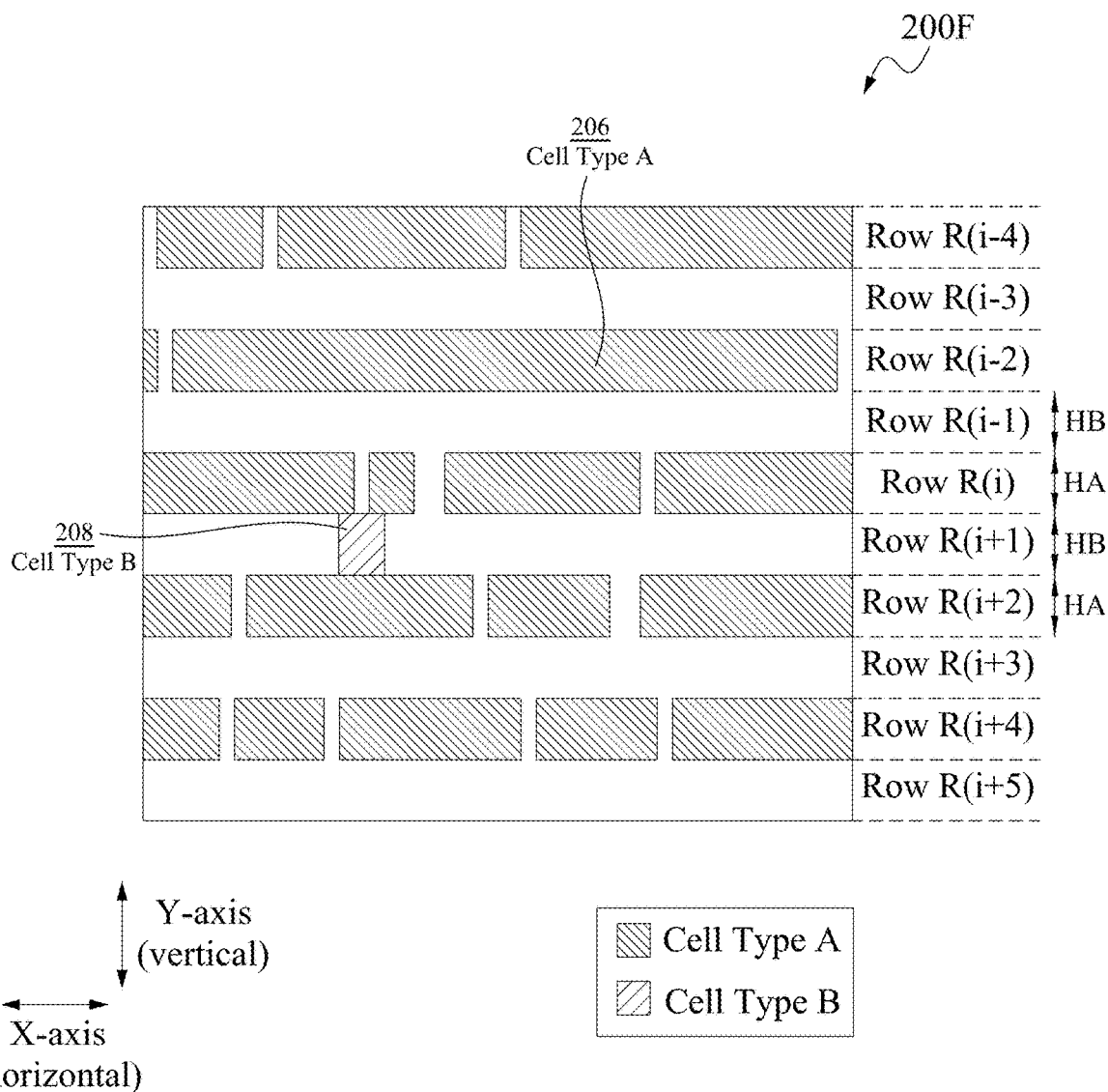
Figure 2G:
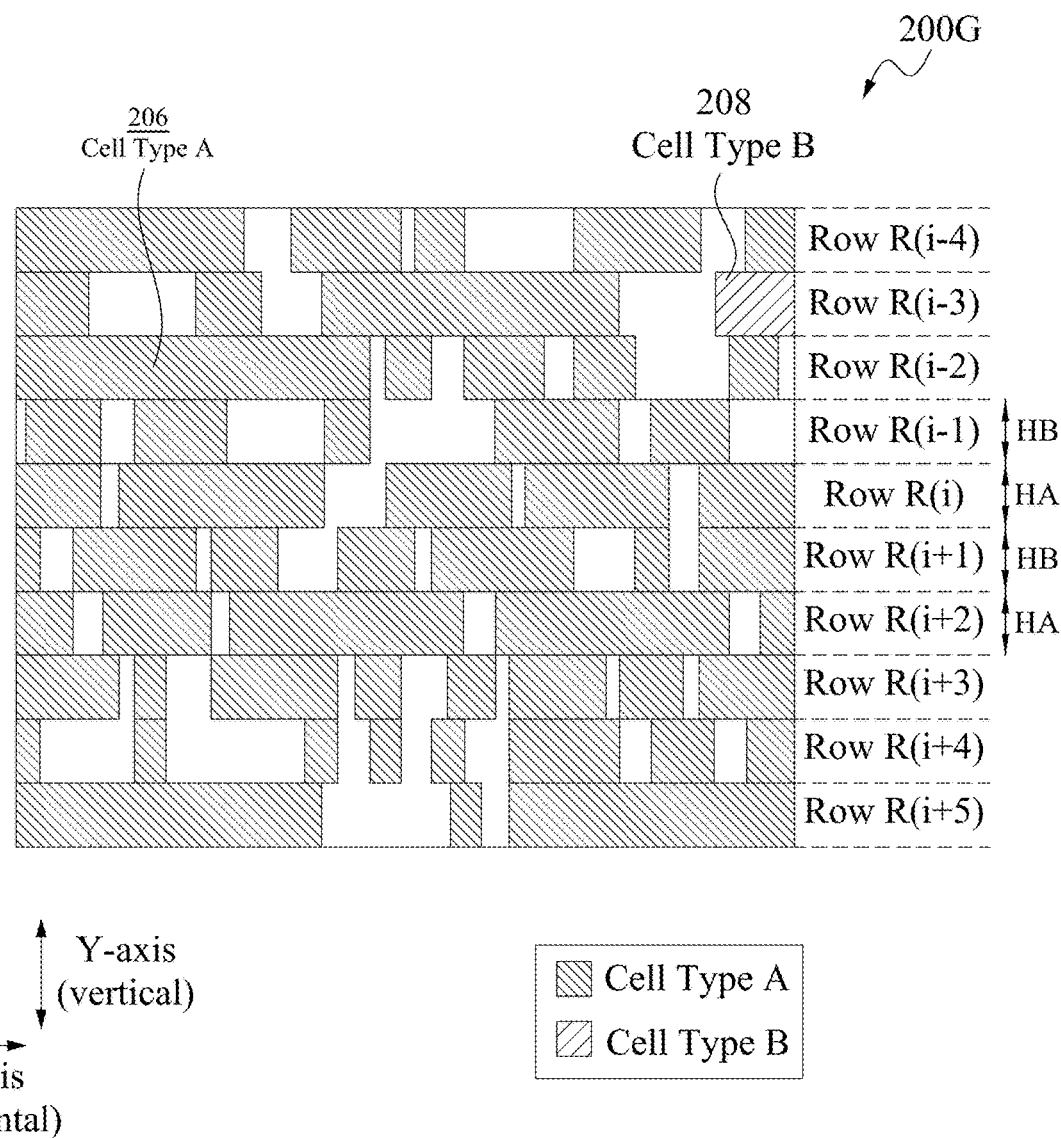

FIGS. 2F and 2G are corresponding layout diagrams 200F and 200G for corresponding semiconductor devices, in accordance with at least one embodiment of the present disclosure.

Layout diagram 200F of FIG. 2F is a zoomed-in view of a sub-area within area 204 of layout diagram 200B of FIG. 2B, which corresponds to the zoomed-in view of layout diagram 200C of FIG. 2C but is less-zoomed in than layout diagram 200C. As such, layout diagram 200F shows more of area 204 than is shown by layout diagram 200C. Accordingly, layout diagram 200F is similar to layout diagram 200C. For brevity, the discussion will focus more on differences between layout diagram 200F and layout diagram 200C than on similarities. In addition to the portions of rows R(i−3)-R(i+3) shown in layout diagram 200C, layout diagram 200F also shows portions of rows R(i−4), R(i+4) and R(i+5). In FIGS. 2F and 2G, rows R(i−4), R(i−2), R(i), R(i+2) and R(i+4) are of height HA, and rows R(i−3), R(i−1), R(i+1), R(i+3) and R(i+5) are of height HB.

Layout diagram 200G of FIG. 2G is a view of substantially the same sub-area within area 204 of layout diagram 200B of FIG. 2B that is shown in layout diagram 200F of 2F. However, layout diagram 200G is a refinement of layout diagram 200F resulting from having applied one or more of the refinement methods disclosed herein to layout diagram 200F.

Instances of cells 206 of type A shown in FIG. 2C (not called out with reference numerals) are substituted with corresponding instances of multi-row-height cells in FIG. 2G (not called out with reference numerals). By inspection, there is substantially less empty space in layout diagram 200G than in layout diagram 200F.

More particularly, in FIG. 2F, before having been subjected to one or more of the refinement methods disclosed herein: rows R(i−4), R(i−2), R(i), R(i+2) and R(i+4) in layout diagram 200F collectively are about 93.1.% full leaving about 6.9% empty space; rows R(i−3), R(i−1), R(i+1), R(i+3) and R(i+5) in layout diagram 200F are about 1.8% full, leaving about 98.2% empty space; and overall layout diagram 200F is about 52.6% full, leaving about 47.4% empty space.

By contrast, in FIG. 2G, after having been subjected to one or more of the refinement methods disclosed herein: rows R(i−4), R(i−2), R(i), R(i+2) and R(i+4) in layout diagram 200G collectively are about 69.3% full leaving about 30.7% empty space; rows R(i−3), R(i−1), R(i+1), R(i+3) and R(i+5) in layout diagram 200G are about 70.1% full, leaving about 29.9% empty space; and overall layout diagram 200G is about 69.7% full, leaving about 30.3% empty space.

Having applied one or more of the refinement methods disclosed herein to layout diagram 200F to generate corresponding layout diagram 200G, the results are: aggregate cell densities in rows R(i−4), R(i−2), R(i), R(i+2) and R(i+4) are decreased by about 23.8%; aggregate cell densities in rows R(i−3), R(i−1), R(i+1), R(i+3) and R(i+5) are increased by about 68.3%; and a net cell density of rows R(i−4) through R(i+5) is increased by about 22.2%.

In some embodiments, for a given area in a layout diagram which includes cell regions arranged in alternating first and second rows extending substantially parallel to a first direction, and wherein (A) the first and second rows having corresponding first and second heights relative to a substantially perpendicular second direction, (B) a majority of the cells spanning a single row relative to the second direction, (C) a minority of the cells spanning two or more rows relative to the second direction, and (D) the first and second rows having corresponding high and low initial cell densities, a benefit of having applied one or more of the refinement methods disclosed herein to the layout diagram is that the resultant layout diagram has resultant cell densities of the first rows which are approximately the same and resultant cell densities of the second rows which are substantially increased.

In some embodiments, the resultant layout diagram has resultant cell densities of the first rows which are approximately the same and resultant cell densities of the second rows, D_2nd, which are which are ($\approx$40%)≤D_2nd. A semiconductor device fabricated based on the resultant layout diagram has cell densities of the first rows which are approximately the same and cell densities of the second rows, D_2nd, which are ($\approx$40%)≤D_2nd.

In some embodiments, the resultant layout diagram has resultant cell densities of the first rows which are approximately the same and resultant cell densities of the second rows, D_2nd, which are at least in the range of ($\approx$40%) ≤D_2nd≤($\approx$=70%). A semiconductor device fabricated based on the resultant layout diagram has cell densities of the first rows which are approximately the same and cell densities of the second rows, D_2nd, which are at least in the range of ($\approx$40%)≤D_2nd≤($\approx$=70%).

In a worst case scenario in which the initial cell densities of the first rows are about 100% and the initial cell densities of the second rows are about 0%, the resultant cell densities of the first rows are approximately the same and the resultant cell densities of the second rows being at least in the range of ($\approx$40%)≤D_2nd≤($\approx$=70%), which represents an improvement in cell density change, ΔD, for the second rows in the range of ($\approx$40%)≤ΔD_2nd≤($\approx$=70%).

FIGS. 3A-3E are corresponding layout diagrams 300A (D1), 300B(D0.5), 300C(D1.5), 300D(D2.5) and 300E(D3) in accordance with some embodiments.

The examples discussed above have assumed the context of inverter cells. More particularly, the examples discussed above have assumed the substitution of inverter cells of height HA with corresponding multi-row-height inverter cells of various heights HC, HD and HE and corresponding various widths. Layout diagram 300A(D1) shows in more detail an example of an inverter cell of type A having height HA. FIGS. 3C, 3D and 3E (discussed below) show, in more detail, examples of inverter cells of corresponding heights HC, HD and HE which can be substituted for the inverter cell of FIG. 3A. FIG. 3B (discussed below) shows in more detail an example of an inverter cell of height HB which is combinable with the inverter cell of FIG. 3A to form the examples of inverter cells of corresponding heights HC, HD and HE shown in corresponding FIGS. 3C-3E.

Figure 3A:
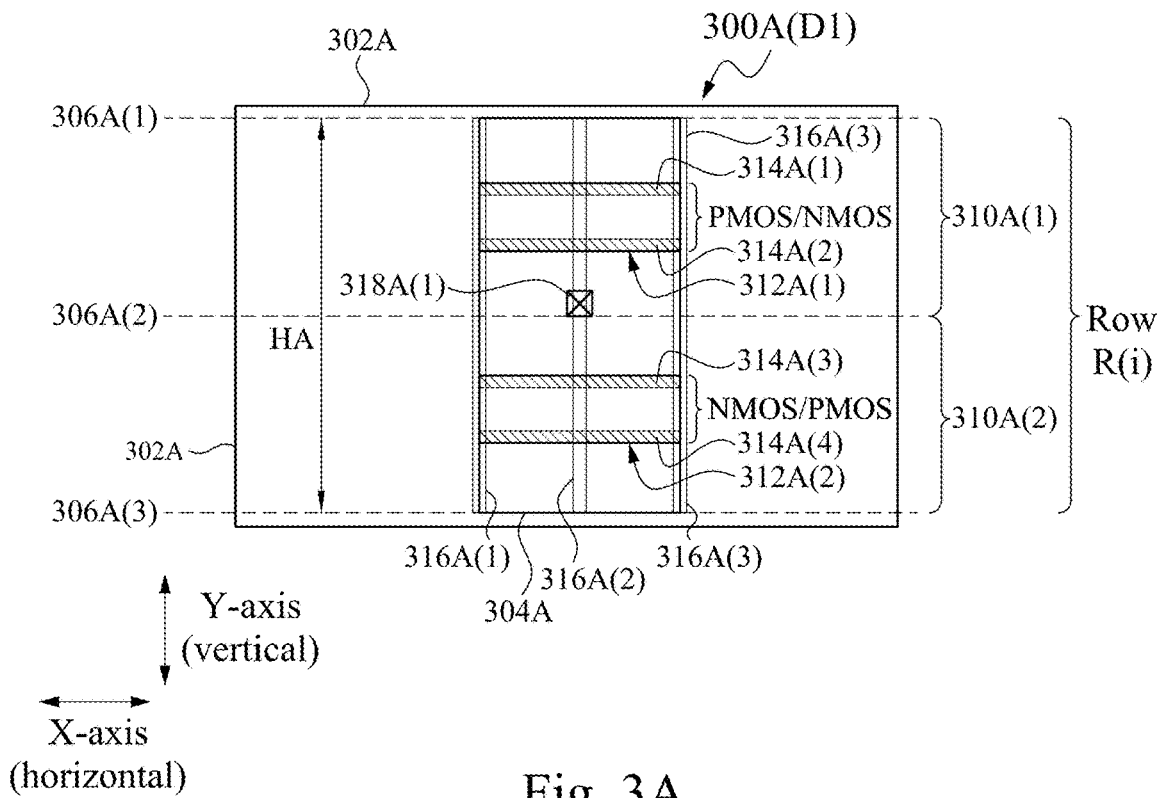
FIGS. 3A-3E are corresponding layout diagrams, in accordance with some embodiments.
Figure 3B:
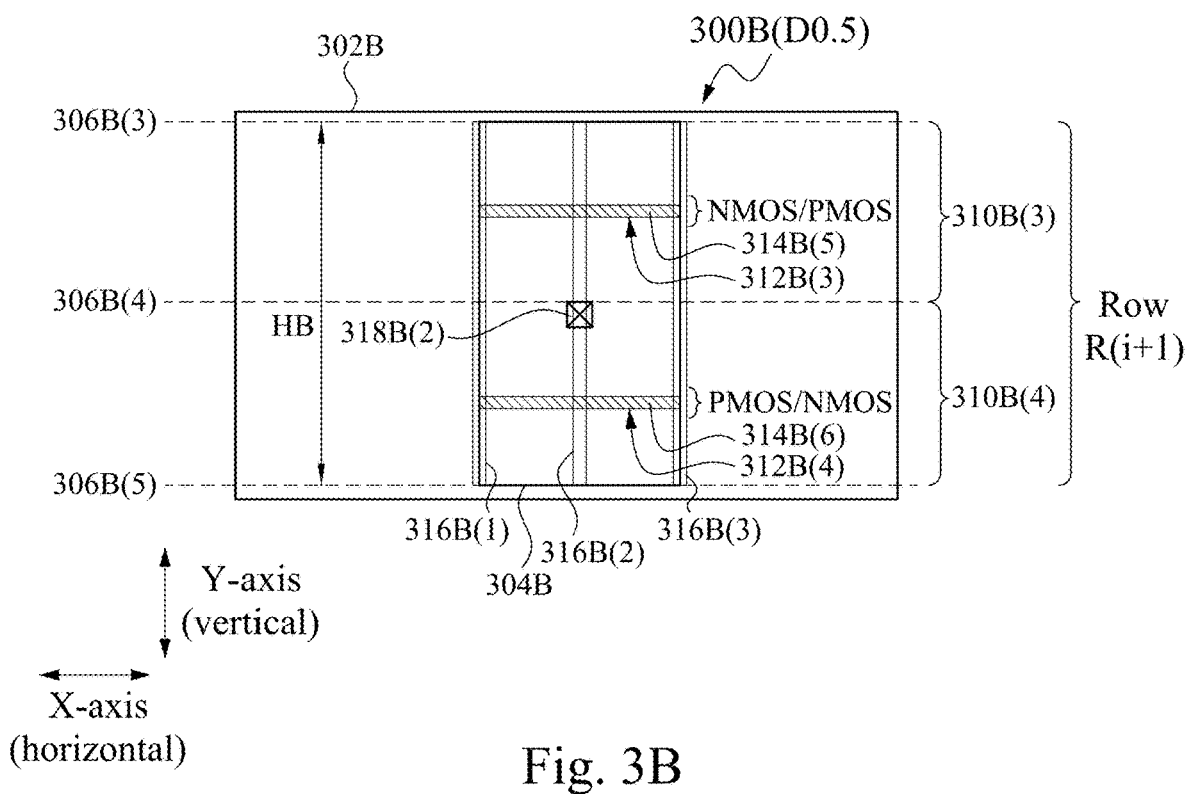
Figure 3C:
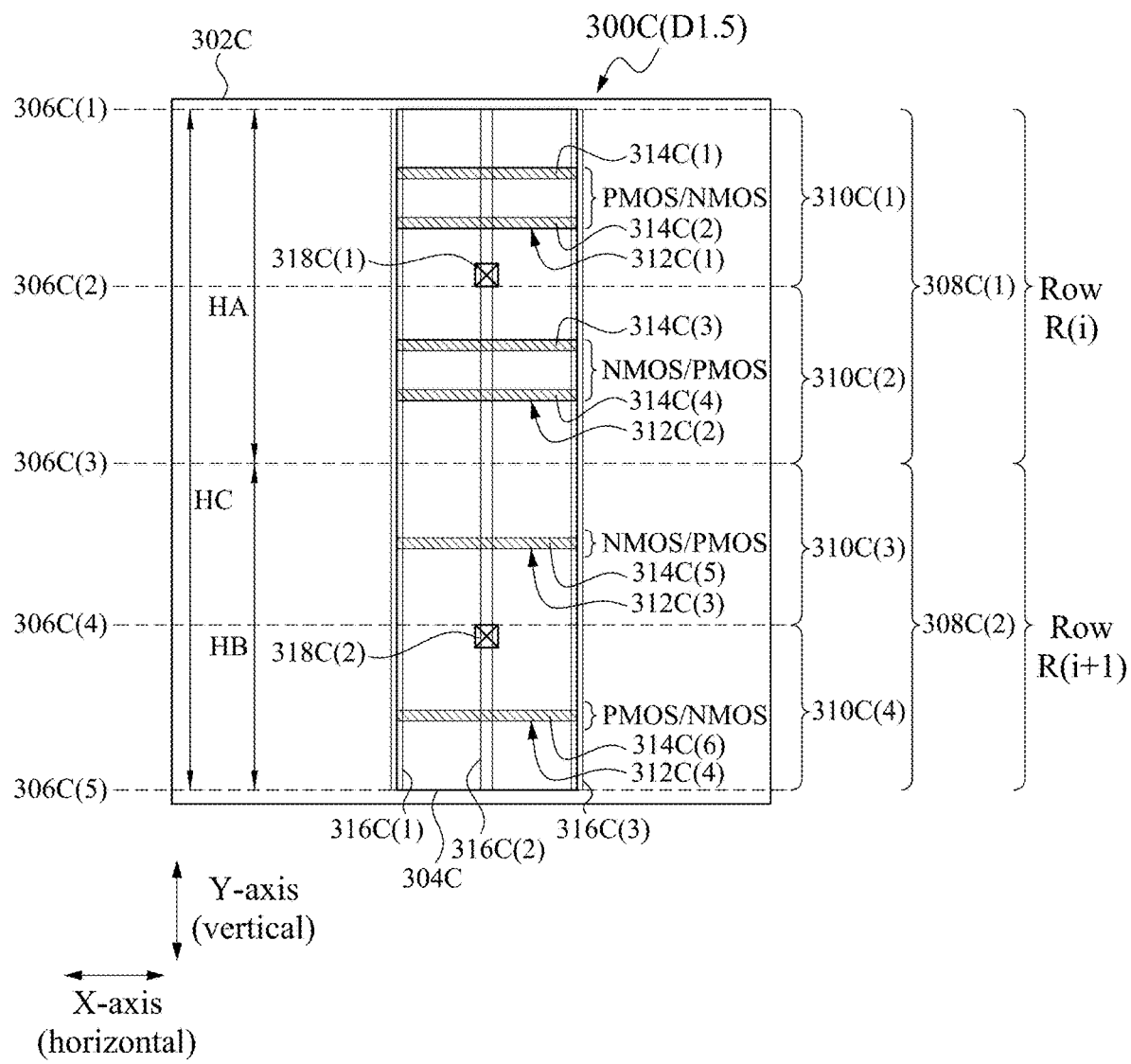
Figure 3D:
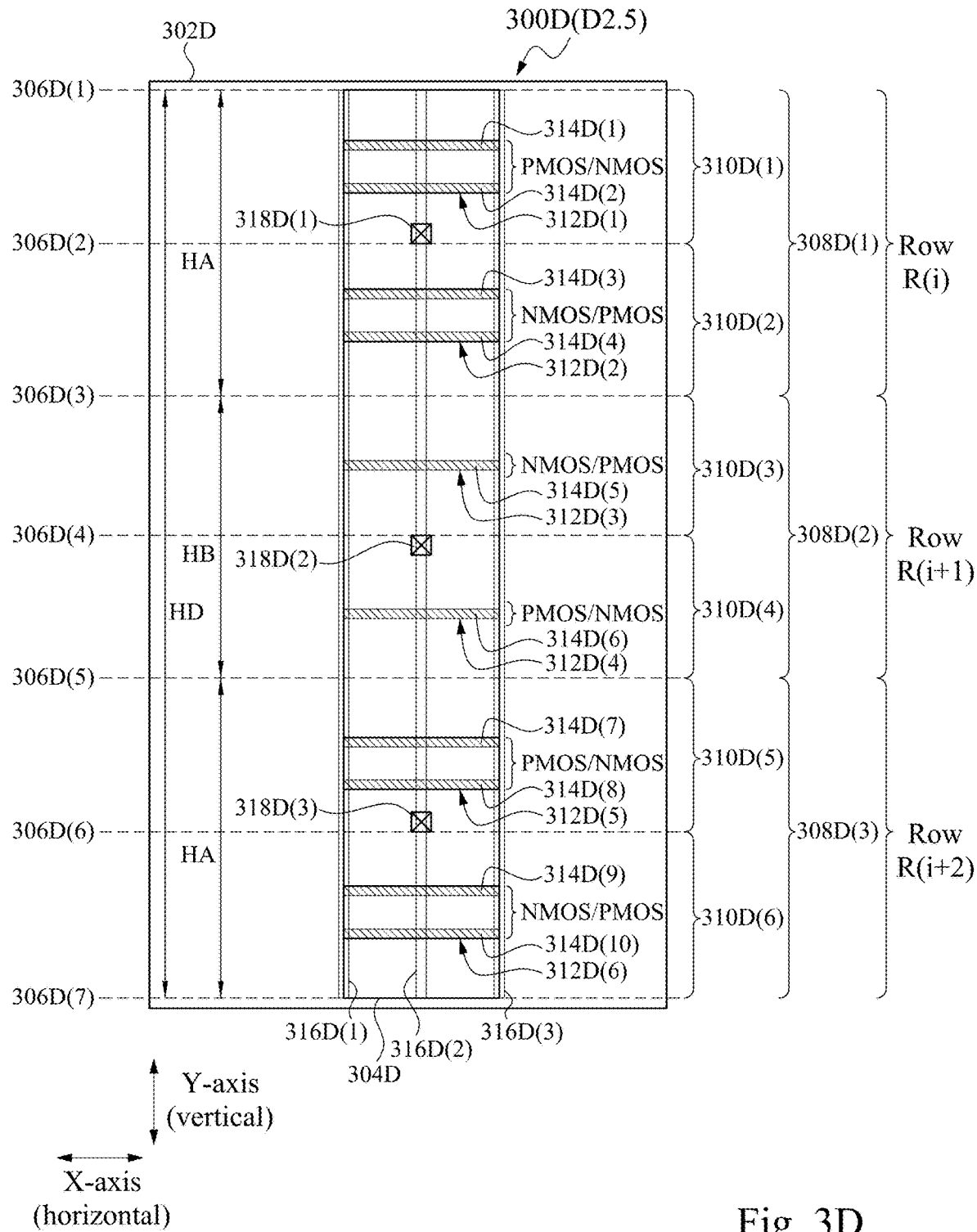
Figure 3E:
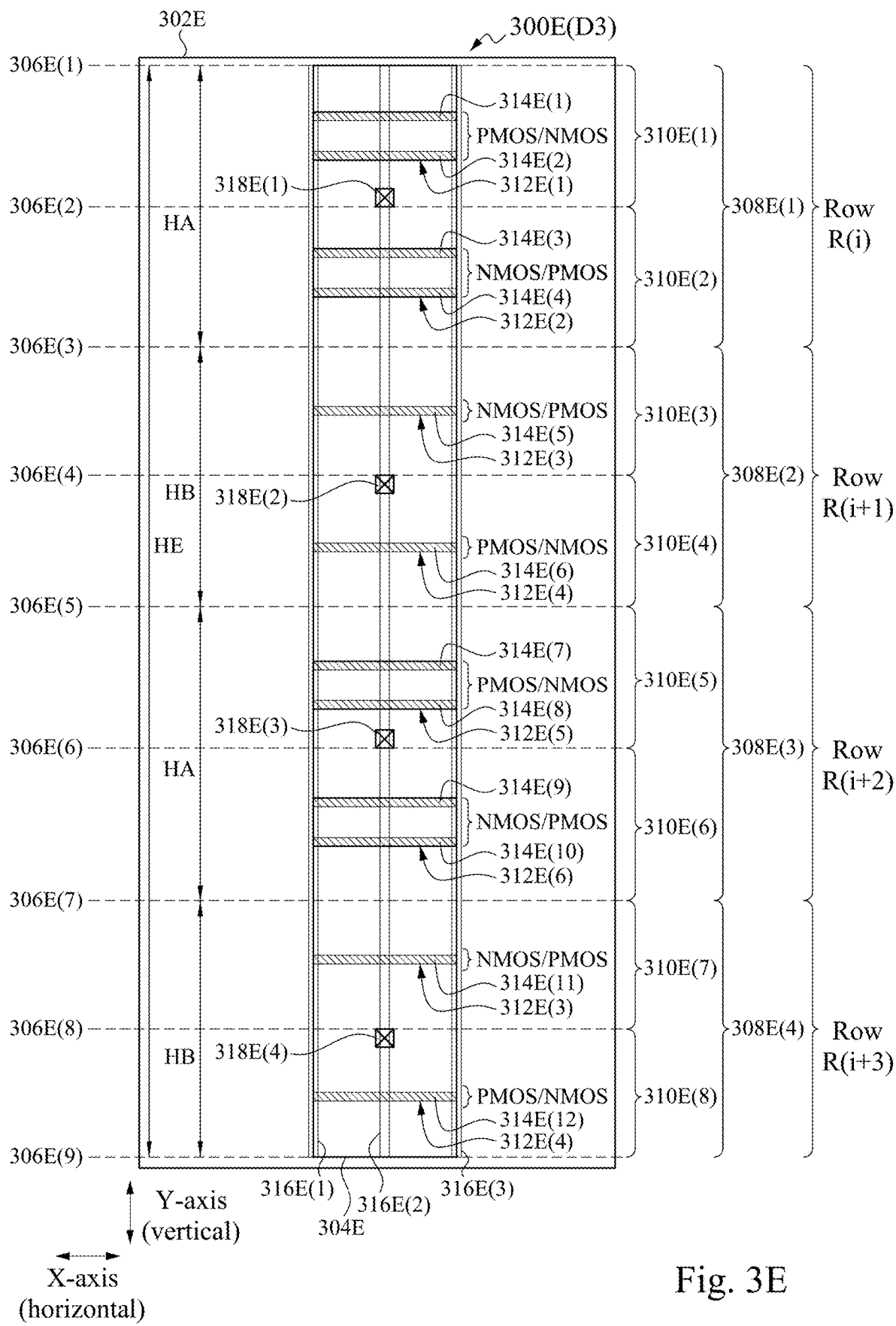

In FIG. 3A, cell 304A is an INVD1 type of inverter cell, which is reflected in the parenthetical D1 in reference number 300A(D1). Cell 304A is disposed in row R(i). Layout diagram 300A(D1) includes a substrate pattern 302A and a cell 304A. Layout diagram 300A(D1) is shown in the context of reference lines 306A(1), 306A(2), and 306A(3) which extend in a first direction. In FIG. 3A, the first direction is the horizontal direction. In some embodiments, the first direction is a direction other than the horizontal direction. Cell 304A has a size in a second direction (height) equal to HA In FIG. 2A, the second direction is the vertical direction. In some embodiments, the second direction is a direction other than the vertical direction.

Cell 304A has a top edge aligning with reference line 306A(1) and a bottom edge aligning with reference line 306A(3). Cell 304A is divided by reference line 306A(2) into upper portion 310A(1) and lower portion 310A(2)

Cell 304A includes active area patterns 312A(1) and 312A(2). Long axes of active area patterns 312A(1)-312A (2) extend in the horizontal direction. In FIG. 3A, active area patterns 312A(1), 312A(2), 312A(3) and 312A(4) are designated for finFET configuration. In some embodiments, active area patterns 312A(1)-312A(2) are designated for a transistor configuration other than finFET configuration.

Cell 304A includes fin patterns 314A(1), 314A(2), 314A (3) and 314A(4) on substrate pattern 302A. Long axes of fin patterns 314A(1)-314A(4) extend in the horizontal direction. Fin patterns 314A(1) and 314A(2) represent active area pattern 312A(1). Fin patterns 314A(3) and 314A(4) represent active area pattern 312A(2).

In some embodiments, fin patterns 314A(1) and 314A(2) are designated to be doped for PMOS configuration, and fin patterns 314A(3) and 314A(4) are designated to be doped for NMOS configuration. In some embodiments, fin patterns 314A(1) and 314A(2) are designated to be doped for NMOS configuration, and fin patterns 314A(3) and 314A(4) are designated to be doped for PMOS configuration. In some embodiments, fin patterns 314A(1), 314A(2), 314A(3) and 314A(4) are designated to be doped for various other configurations.

Cell 304A further includes gate patterns 316A(1), 316A(2) and 316A(3) on fin patterns 314A(1), 314A(2), 314A(3) and 314A(4). Long axes of gate patterns 316A(1)-316A(3) extend in the vertical direction. Accordingly, cell 304A has a width of 2φCPP. In some embodiments, φ=1. Cell 304A further includes a via pattern 318A(1) on, and aligned with respect to, gate pattern 316A(2).

In some embodiments, a height of fin patterns 314A(1)-314A(4) corresponds to a minimum height of corresponding fins in a semiconductor device produced by a process technology node associated with layout diagrams such as layout diagram 300A(D1).

In some embodiments, the height of active area patterns 312A(1) and 312A(2) corresponds to a minimum height of corresponding fins, plus a minimum separation distance in the vertical direction between fins, in a semiconductor device produced by a process technology node associated with layout diagrams such as layout diagram 300A(D1). In some embodiments, a size in the horizontal direction (width) of gate patterns 316A(1)-316A(3) corresponds to a minimum width of corresponding gate lines in a semiconductor device produced by a process technology node associated with layout diagrams such as layout diagram 300A(D1). In some embodiments, a size in the horizontal direction (pitch) between neighboring ones of gate patterns 316A(1)-316A(3) corresponds to a pitch between corresponding gate lines in a semiconductor device produced by a process technology node associated with layout diagrams such as layout diagram 300A(D1). In some embodiments, the pitch between neighboring ones of gate patterns 316A(1)-316A(3) is referred to as contact poly pitch (APP). In some embodiments, the APP is a size in the horizontal direction (pitch) between vertical midlines of neighboring ones of gate patterns 316A(1)-316A(3). In some embodiments, heights HA and HB of corresponding rows R(i) and R(i+1) are set by corresponding design rules for a process technology node associated with layout diagrams such as layout diagram 300A(D1).

In FIG. 3B, cell 304B is an INVD0.5 type of inverter cell, which is reflected in the parenthetical D0.5 in reference number 300B(D0.5). Cell 304B is disposed in row R(i+1). Layout diagram 300B(D0.5) includes a substrate pattern 302B and a cell 304B. Layout diagram 300B(D0.5) is shown in the context of reference lines 306B(3), 306B(4), and 306B(5) which extend in the horizontal direction. Cell 304B has a height equal to HB Cell 304B has a top edge aligning with reference line 306B(3) and a bottom edge aligning with reference line 306B(5). Cell 304B is divided by reference line 306B(4) into upper portion 310B(3) and lower portion 310B(4)

Cell 304B includes active area patterns 312B(3) and 312B(4). Long axes of active area patterns 312B(3)-312B(4) extend in the horizontal direction. In FIG. 3B, active area patterns 312B(3) and 312B(4) are designated for finFET configuration. In some embodiments, active area patterns 312B(3)-312B(4) are designated for a transistor configuration other than finFET configuration.

Cell 304B includes fin patterns 314B(5) and 314B(6) on substrate pattern 302B. Long axes of fin patterns 314B(5)-314B(6) extend in the horizontal direction. Fin pattern 314B(5) represents active area pattern 312B(3). Fin pattern 314B(6) represents active area pattern 312B(4).

In some embodiments, fin pattern 314B(5) is designated to be doped for PMOS configuration, and fin pattern 314B(6) is designated to be doped for NMOS configuration. In some embodiments, fin pattern 314B(5) is designated to be doped for NMOS configuration, and fin pattern 314B(6) is designated to be doped for PMOS configuration. In some embodiments, fin patterns 314B(5) and 314B(6) are designated to be doped for various other configurations.

Cell 304B further includes gate patterns 316B(1), 316B(2) and 316B(3) on fin patterns 314B(1), 314B(2), 314B(3), 314B(4), 314B(5) and 314B(6). Long axes of gate patterns 316B(1)-316B(3) extend in the vertical direction. Cell 304B further includes a via pattern 318B(2) on, and aligned with respect to, gate pattern 316B(2).

In some embodiments, a height of fin patterns 314B(1)-314B(4) corresponds to a minimum height of corresponding fins in a semiconductor device produced by a process technology node associated with layout diagrams such as layout diagram 300B(D0.5).

In some embodiments, the height of active area patterns 312B(3) and 312B(4) corresponds to a minimum height of corresponding fins in a semiconductor device produced by a process technology node associated with layout diagrams such as layout diagram 300B(0.5). In some embodiments, a size in the horizontal direction (width) of gate patterns 316B(1)-316B(3) corresponds to a minimum width of corresponding gate lines in a semiconductor device produced by a process technology node associated with layout diagrams such as layout diagram 300B(D0.5). In some embodiments, a size in the horizontal direction (pitch) between neighboring ones of gate patterns 316B(1)-316B(3) corresponds to a pitch between corresponding gate lines in a semiconductor device produced by a process technology node associated with layout diagrams such as layout diagram 300B(D0.5). In some embodiments, the pitch between neighboring ones of gate patterns 316B(1)-316B(3) is referred to as contact poly pitch (BPP). In some embodiments, the BPP is a size in the horizontal direction (pitch) between vertical midlines of neighboring ones of gate patterns 316B(1)-316B(3). In some embodiments, heights HA and HB of corresponding rows R(i) and R(i+1) are set by corresponding design rules for a process technology node associated with layout diagrams such as layout diagram 300B(D0.5).

In FIG. 3C, cell 304C is an INVD1.5 type of inverter cell, which is reflected in the parenthetical D1.5 in reference number 300C(D1.5). Cell 304C is a combination of cell 304A stacked on cell 304B. Cell 304C is disposed in rows R(i) and R(i+1). In FIG. 3C, layout diagram 300C(D1.5) includes a substrate pattern 302C and a cell 304C. Layout diagram 300C(D1.5) is shown in the context of reference lines 306C(1), 306C(2), 306C(3), 306C(4) and 306C(5) which extend in the horizontal direction.

Cell 304C has a top edge aligning with reference line 306C(1) and a bottom edge aligning with reference line 306C(5). Cell 304C is divided by reference line 306C(3) into upper portion 308C(1) and lower portion 308C(2), upper portion 308C(1) being located in row R(i) and corresponding to cell 304A, and lower portion 308C(2) being located in row R(i+1) and corresponding to cell 304B. Accordingly, relative to a second direction substantially perpendicular to the first direction, upper portion 308C(1) has a height equal to HA, and lower portion 308C(2) has height equal to HB.

Cell 304C has a height, HC, where HC=HA+HB. In some embodiments, cell 304C is referred to as a double height (DH) cell.

Upper portion 308C(1) of cell 304C is divided by reference line 306C(2) into an upper part 310C(1) and a lower part 310C(2). Lower portion 308C(2) of cell 304C is divided by reference line 306C(4) into an upper part 310C(3) and a lower part 310C(4).

Cell 304C includes active area patterns 312C(1), 312C(2), 312C(3) and 312C(4). Long axes of active area patterns 312C(1)-312C(4) extend in the horizontal direction. In FIG. 3C, active area patterns 312C(1), 312C(2), 312C(3) and 312C(4) are designated for finFET configuration. In some embodiments, active area patterns 312C(1), 312C(2), 312C(3) and 312C(4) are designated for a transistor configuration other than finFET configuration.

Cell 304C includes fin patterns 314C(1), 314C(2), 314C(3), 314C(4), 314C(5) and 314C(6) on substrate pattern 302C. Long axes of fin patterns 314C(1)-314C(6) extend in the horizontal direction. Fin patterns 314C(1) and 314C(2) represent an active area pattern 312C(1). Fin patterns 314C(3) and 314C(4) represent active area pattern 312C(2). Fin pattern 314C(5) represents active area pattern 312C(3). Fin pattern 314C(6) represents an active area pattern 312C(4).

In some embodiments, fin patterns 314C(1), 314C(2) and 314C(6) are designated to be doped for PMOS configuration, and fin patterns 314C(3), 314C(4) and 314C(4) are designated to be doped for NMOS configuration. In some embodiments, fin patterns 314C(1), 314C(2) and 314C(6) are designated to be doped for NMOS configuration, and fin patterns 314C(3), 314C(4) and 314C(4) are designated to be doped for PMOS configuration. In some embodiments, fin patterns 314C(1), 314C(2), 314C(3), 314C(4), 314C(5) and 314C(6) are designated to be doped for various other configurations.

Cell 304C further includes gate patterns 316C(1), 316C(2) and 316C(3) on fin patterns 314C(1), 314C(2), 314C(3), 314C(4), 314C(5) and 314C(6). Long axes of gate patterns 316C(1)-316C(3) extend in the vertical direction. Cell 304C further includes via patterns 318C(1) and 318C(2) on, and aligned with respect to, gate pattern 316C(2).

In some embodiments, a height of fin patterns 314C(1)-314C(6) corresponds to a minimum height of corresponding fins in a semiconductor device produced by a process technology node associated with layout diagrams such as layout diagram 300C(D1.5).

In some embodiments, the height of active area patterns 312C(1) and 312C(2) corresponds to a minimum height of corresponding fins, plus a minimum separation distance in the vertical direction between fins, in a semiconductor device produced by a process technology node associated with layout diagrams such as layout diagram 300C(D1.5). In some embodiments, a size in the horizontal direction (width) of gate patterns 316C(1)-316C(3) corresponds to a minimum width of corresponding gate lines in a semiconductor device produced by a process technology node associated with layout diagrams such as layout diagram 300C(D1.5). In some embodiments, a size in the horizontal direction (pitch) between neighboring ones of gate patterns 316C(1)-316C(3) corresponds to a pitch between corresponding gate lines in a semiconductor device produced by a process technology node associated with layout diagrams such as layout diagram 300C(D1.5). In some embodiments, the pitch between neighboring ones of gate patterns 316C(1)-316C(3) is referred to as contact poly pitch (CPP). In some embodiments, the CPP is a size in the horizontal direction (pitch) between vertical midlines of neighboring ones of gate patterns 316C(1)-316C(3). In some embodiments, heights HA and HB of corresponding rows R(i) and R(i+1) are set by corresponding design rules for a process technology node associated with layout diagrams such as layout diagram 300C(D1.5).

Layout diagram 300D(D2.5) is similar to layout diagrams 300C(D1.5) and 300A(D1). For brevity, the discussion will focus more on differences between layout diagram 300D(D2.5) and layout diagrams 300C(D1.5) and 300A(D1) than on similarities.

In FIG. 3D, cell 304D is an INVD2.5 type of inverter cell, which is reflected in the parenthetical D2.5 in reference number 300D(D2.5). Cell 304D is a combination of cell 304C stacked on cell 304A. Cell 304D is disposed in rows R(i), R(i+1) and R(i+2)). Layout diagram 300D(D2.5) is shown in the context of reference lines 306D(1), 306D(2), 306D(3), 306D(4), 306D(5), 306D(6) and 306D(7) which extend in the horizontal direction.

Cell 304D has a top edge aligning with reference line 306D(1) and a bottom edge aligning with reference line 306D(7). Cell 304D is divided by reference lines 306D(3) and 306D(5) into corresponding upper portion 308D(1), middle portion 308D(2) and lower portion 308D(3). Upper portion 308D(1) is located in row R(i). Middle portion 308D(2) is located in row R(i+1). Upper portion 308D(1) and middle portion 308D(2) correspond to cell 304C. Lower portion 308D(3) is located in row R(i+2) and corresponds to cell 304A. Accordingly, upper portion 308D(1) has a height equal to HA, middle portion 308D(2) has a height equal to HB and lower portion 308D(3) has height equal to HA. Cell 302D has a height, HD, where HD=HA+HB+HA. In some embodiments, cell 304D is referred to as a triple height (TH) cell.

Layout diagram 300E(D3) is similar to layout diagrams 300D(D2.5) and 300B(D0.5). For brevity, the discussion will focus more on differences between layout diagram 300E(D3) and layout diagrams 300D(D2.5) and 300B(D0.5) than on similarities.

In FIG. 3E, cell 304E is an INVD3 type of inverter cell, which is reflected in the parenthetical D3 in reference number 300E(D3). Cell 304E is a combination of cell 304D stacked on cell 304B. Cell 304E is disposed in rows R(i), R(i+1), R(i+2) and R(i+3). Layout diagram 300E(D3) is shown in the context of reference lines 306E(1), 306E(2), 306E(3), 306E(4), 306E(5), 306E(6), 306E(7), 306E(8) and 306E(9) which extend in the horizontal direction.

Cell 304E has a top edge aligning with reference line 306E(1) and a bottom edge aligning with reference line 306E(9). Cell 304E is divided by reference lines 306E(3), 306E(5) and 306E(7) into corresponding portions 308E(1), 308E(2), 308E(3) and 308E(4). Portion 308E(1) is located in row R(i). Portion 308E(2) is located in row R(i+1). Portion 308E(3) is located in row R(i+2). Portion 308E(4) is located in row R(i+3). Portions 308E(1), 308E(2) and 308E(3) correspond to cell 304D. Portion 308E(4) corresponds to cell 304B. Accordingly, portion 308E(1) has a height equal to HA, portion 308E(2) has a height equal to HB, portion 308E(3) has height equal to HA and portion 308E(4) has a height equal to HB. Cell 302E has a height, HE, where HE=HA+HB+HA+HB. In some embodiments, cell 304E is referred to as a quadruple height (QH) cell.

FIGS. 4A-4D are corresponding layout diagrams 400A(D2), 400B(D4), 400C(D6) and 400D(D8) in accordance with some embodiments.

The examples discussed above have assumed the context of inverter cells. More particularly, the examples discussed above have assumed the substitution of inverter cells of height HA with corresponding multi-row-height inverter cells of various heights HC, HD and HE and corresponding various widths. As noted, layout diagram 300A(D1) of FIG. 3A shows in more detail an example of an inverter cell of type A having height HA and a width of 2φCPP. FIGS. 4A-4D (discussed below) show, in more detail, examples of inverter cells of height HA that are wider than cell 304A and have correspondingly greater current driving capacity/capability. The inverters of FIGS. 4A-4D can be substituted with multi-row-height cells according to one or more of the refinement methods disclosed herein.

Figure 4A:
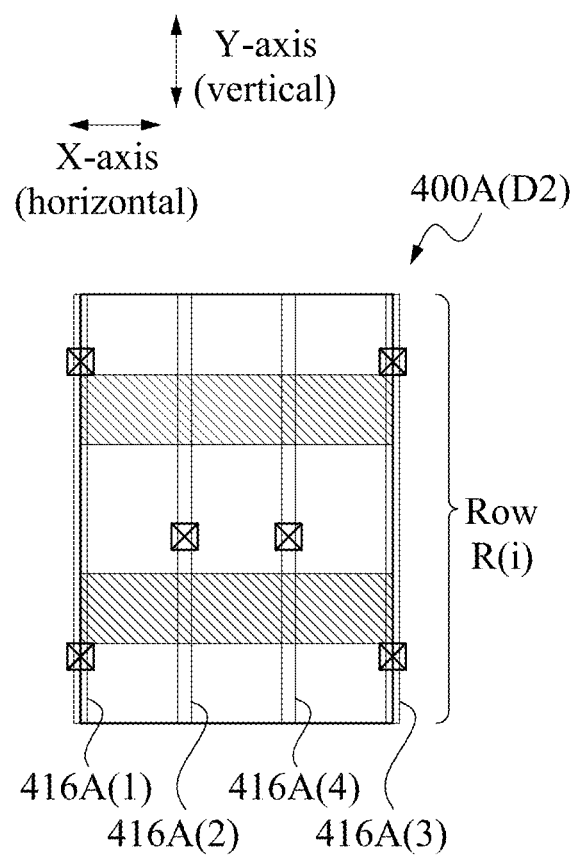
FIGS. 4A-4D are corresponding layout diagrams, in accordance with some embodiments.

In FIG. 4A, layout diagram 400A(D2) is similar to layout diagram 300A(D1) of FIG. 3A. For brevity, the discussion will focus more on differences between layout diagram 400A(D2) and layout diagram 300A(D1) than on similarities.

In FIG. 4A, layout diagram 400A(D2) shows one cell that is an INVD2 type of inverter cell, which is reflected in the parenthetical D2 in reference number 400A(D2). Like cell 304A, the cell in layout diagram 400A(D2) includes gate patterns 416A(1), 416A(2) and 416A(3), but further includes gate pattern 416A(4), which results in the greater current driving capacity/capability of the cell of layout diagram 400A(D2) as compared to cell 304A.

Figure 4B:
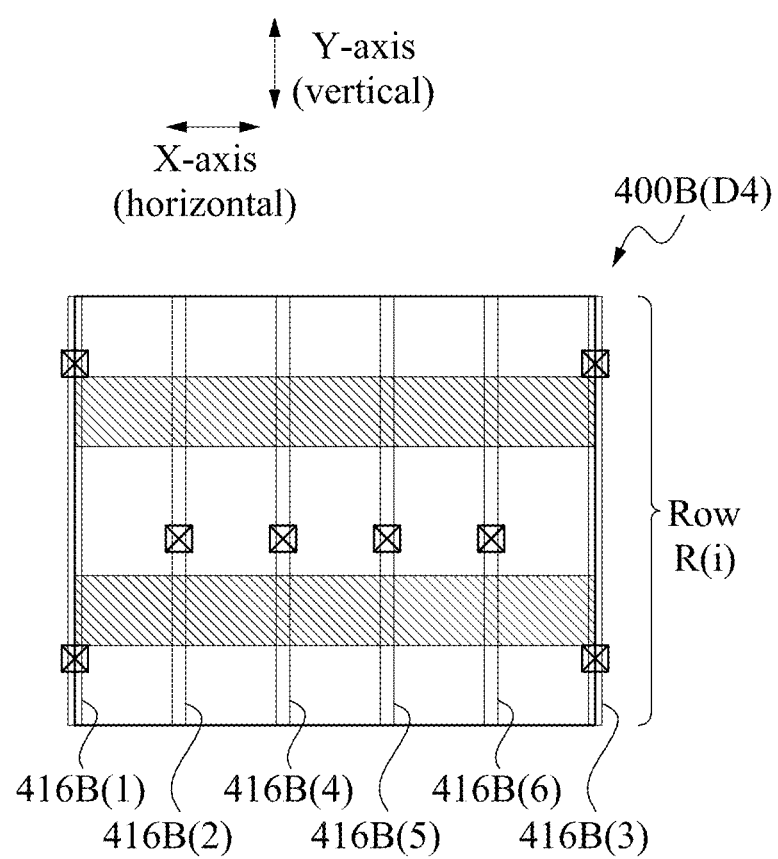

In FIG. 4B, layout diagram 400B(D4) is similar to layout diagram 400A(D2) of FIG. 4A. For brevity, the discussion will focus more on differences between layout diagram 400B(D4) and 400A(D2) than on similarities.

In FIG. 4B, layout diagram 400B(D4) shows one cell that is an INVD4 type of inverter cell, which is reflected in the parenthetical D4 in reference number 400B(D4). Like cell in layout diagram 400A(D2), the cell in layout diagram 400B(D4) includes gate patterns 416B(1)-416B(4), but further includes gate patterns 416B(5)-416B(6), which results in the greater current driving capacity/capability of the cell of layout diagram 400B(D4) as compared to the cell of layout diagram 400A(D2).

Figure 4C:
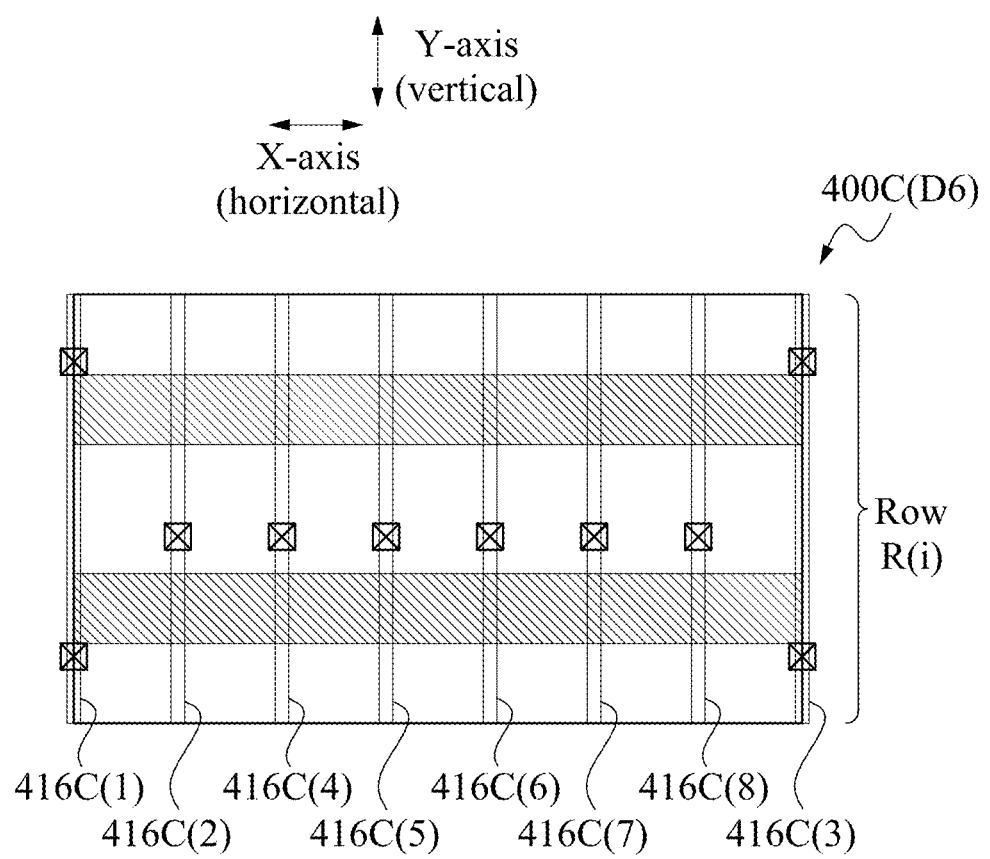

In FIG. 4C, layout diagram 400C(D6) is similar to layout diagram 400B(D4) of FIG. 4B. For brevity, the discussion will focus more on differences between layout diagram 400C(D6) and 400B(D4) than on similarities.

In FIG. 4C, layout diagram 400C(D6) shows one cell that is an INVD6 type of inverter cell, which is reflected in the parenthetical D6 in reference number 400C(D6). Like cell in layout diagram 400B(D4), the cell in layout diagram 400C(D6) includes gate patterns 416C(1)-416C(6), but further includes gate patterns 416C(7)-416C(8), which results in the greater current driving capacity/capability of the cell of layout diagram 400C(D6) as compared to the cell of layout diagram 400B(D4).

Figure 4D:
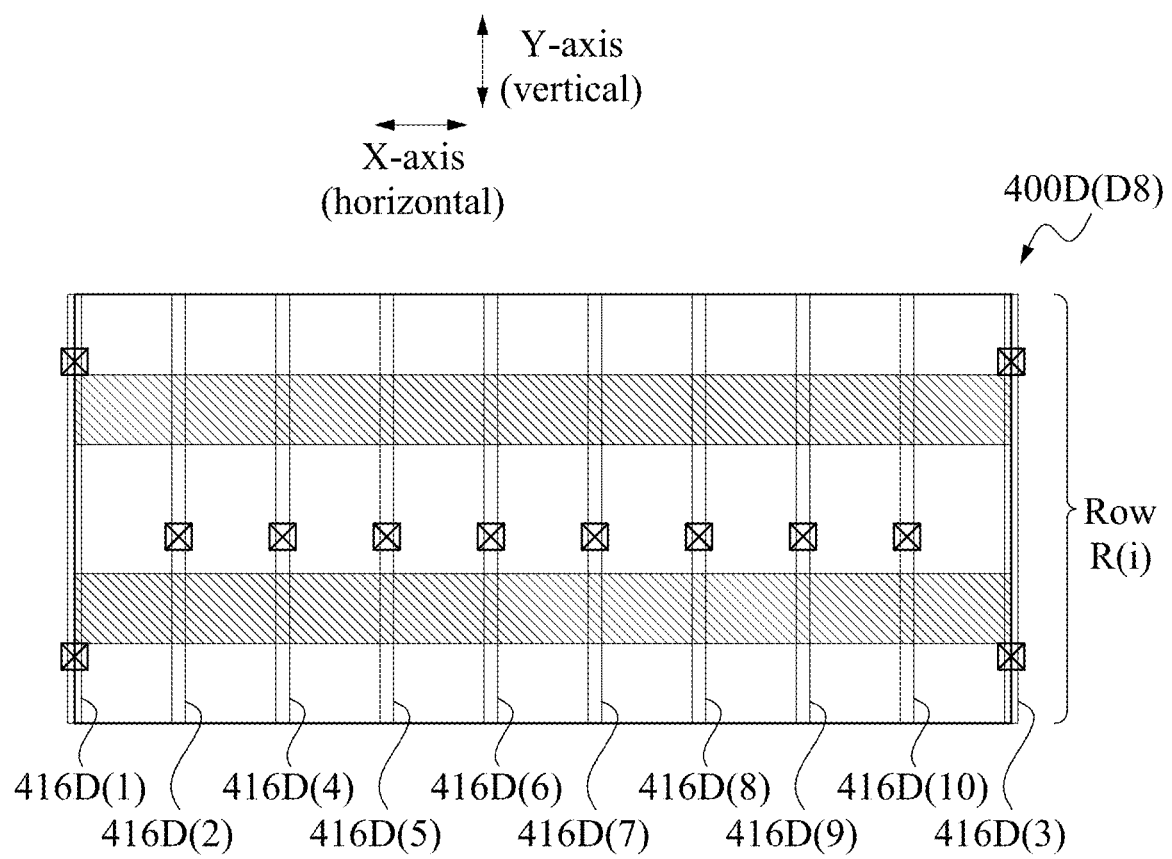

In FIG. 4D, layout diagram 400D(D8) is similar to layout diagram 400C(D6) of FIG. 4C. For brevity, the discussion will focus more on differences between layout diagram 400D(D8) and 400C(D6) than on similarities.

In FIG. 4D, layout diagram 400D(D8) shows one cell that is an INVD8 type of inverter cell, which is reflected in the parenthetical D8 in reference number 400D(D8). Like cell in layout diagram 400C(D6), the cell in layout diagram 400D(D8) includes gate patterns 416D(1)-416D(8), but further includes gate patterns 416D(9)-416D(10), which results in the greater current driving capacity/capability of the cell of layout diagram 400D(D8) as compared to the cell of layout diagram 400C(D6).

Figure 5A:
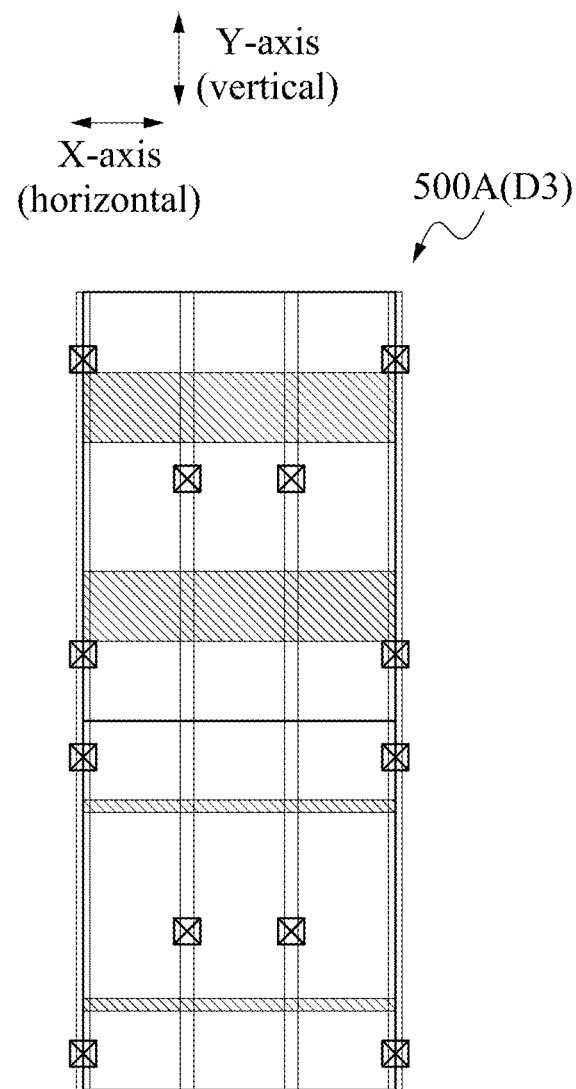
FIGS. 5A-5C are corresponding layout diagrams, in accordance with some embodiments.
Figure 5B:
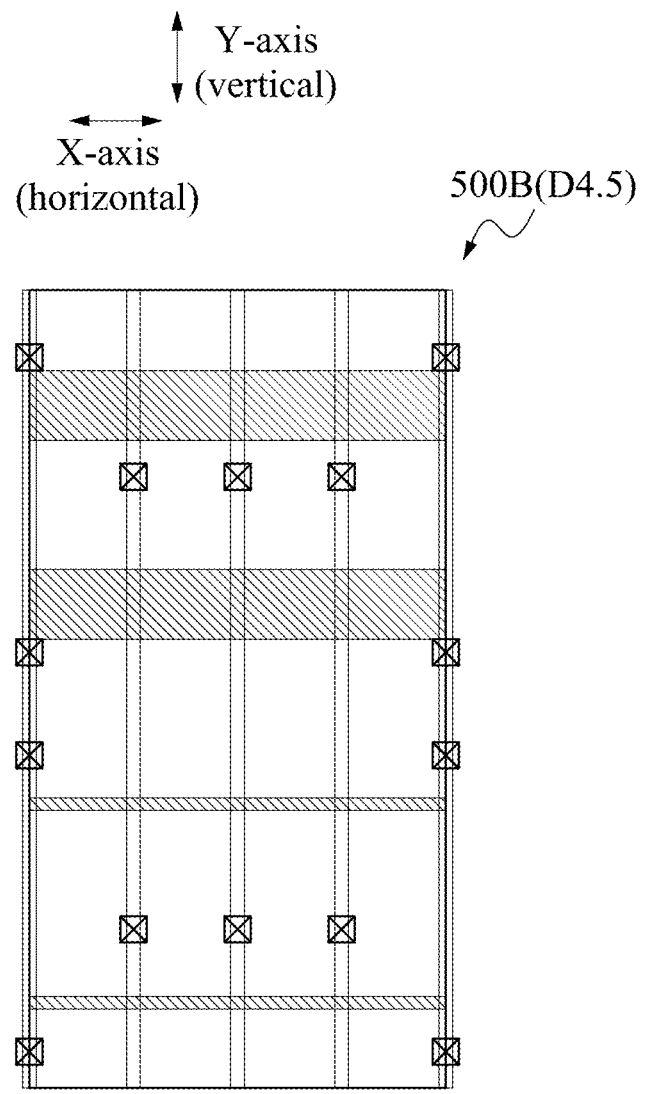
Figure 5C:
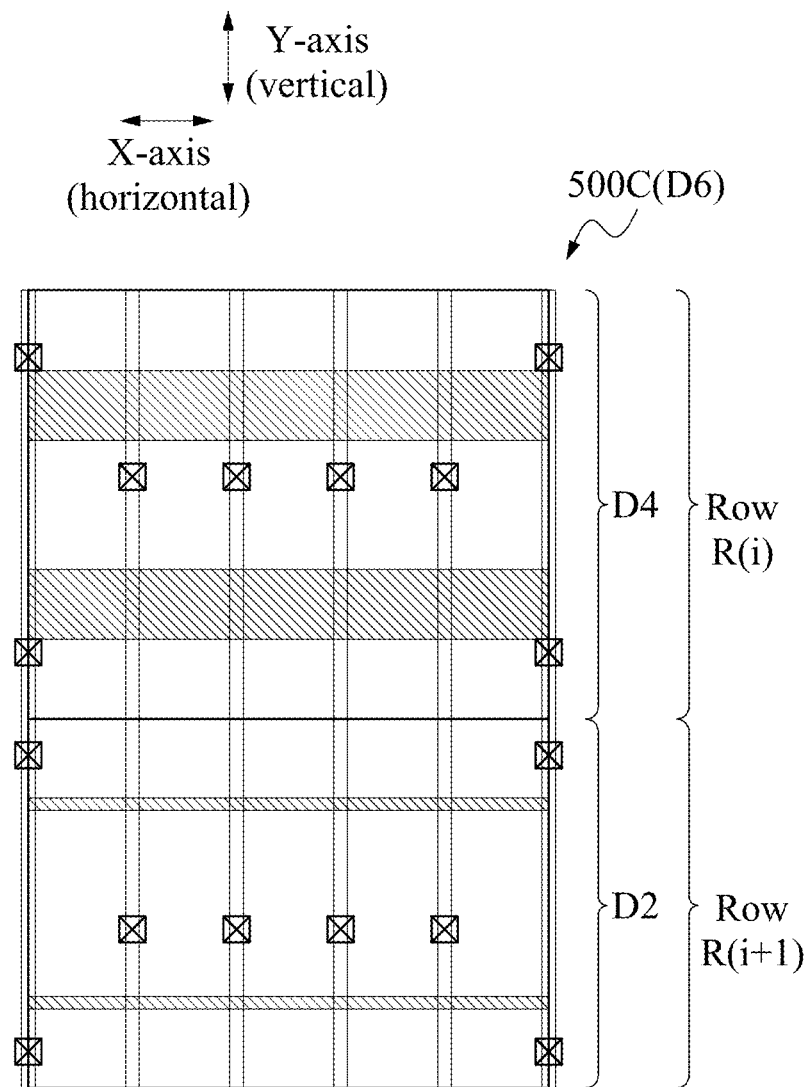

FIGS. 5A-5C are corresponding layout diagrams 500A(D3), 500B(D4.5), and 500C(D6) in accordance with some embodiments.

The examples discussed above have assumed the context of inverter cells. More particularly, the examples discussed above have assumed the substitution of inverter cells of height HA with corresponding multi-row-height inverter cells of various heights HC, HD and HE and corresponding various widths. As noted, layout diagram 300C(D1.5) of FIG. 3C shows in more detail an example of a multi-row inverter cell having height HC and a width of 2φCPP. FIGS. 5A-5C (discussed below) show, in more detail, examples of multi-row inverter cells of height HC that are wider than cell 304C and have correspondingly greater current driving capacity/capability. The inverters of FIGS. 5A-5C are substituted with corresponding inverter cells of height HA according to one or more of the refinement methods disclosed herein.

In FIG. 5A, layout diagram 500A(D3) is similar to layout diagram 300C(D1.5) of FIG. 3C. For brevity, the discussion will focus more on differences between layout diagram 500A(D3) and layout diagram 300C(D1.5) than on similarities.

In FIG. 5A, layout diagram 500A(D3) shows one cell that is an INVD3 type of inverter cell, which is reflected in the parenthetical D3 in reference number 500A(D3). Like cell 304C, the cell in layout diagram 500A(D3) includes three gate patterns, but further includes one additional gate pattern for a total of four gate patterns, which results in the greater current driving capacity/capability of the cell of layout diagram 500A(D3) as compared to cell 304C.

In FIG. 5B, layout diagram 500B(D4.5) is similar to layout diagram 500A(D3) of FIG. 5A. For brevity, the discussion will focus more on differences between layout diagram 500B(D4.5) and 400A(D3) than on similarities.

In FIG. 5B, layout diagram 500B(D4.5) shows one cell that is an INVD4.5 type of inverter cell, which is reflected in the parenthetical D4.5; in reference number 500B(D4.5). Like cell in layout diagram 500A(D3), the cell in layout diagram 500B(D4.5) includes four gate patterns, but further includes one additional gate pattern for a total of five gate patterns, which results in the greater current driving capacity/capability of the cell of layout diagram 500B(D4.5) as compared to the cell of layout diagram 500A(D3).

In FIG. 5C, layout diagram 500C(D6) is similar to layout diagram 500B(D4.5) of FIG. 5B. For brevity, the discussion will focus more on differences between layout diagram 500C(D6) and 500B(D4.5) than on similarities.

In FIG. 5C, layout diagram 500C(D6) shows one cell that is an INVD6 type of inverter cell, which is reflected in the parenthetical D6 in reference number 500C(D5). Like cell in layout diagram 500B(D4.5), the cell in layout diagram 500C(D6) includes five gate patterns, but further includes one additional gate pattern for a total of six gate patterns, which results in the greater current driving capacity/capability of the cell of layout diagram 500C(D6) as compared to the cell of layout diagram 500B(D4.5).

Figure 6A:
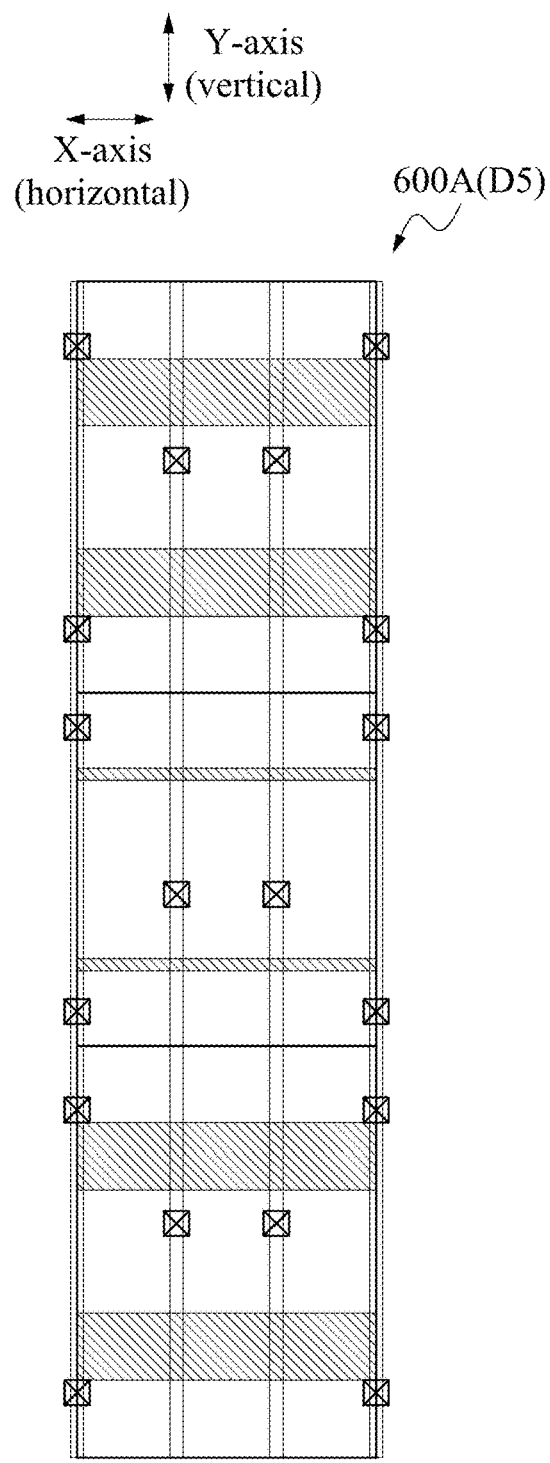
FIGS. 6A-6C are corresponding layout diagrams, in accordance with some embodiments.
Figure 6B:
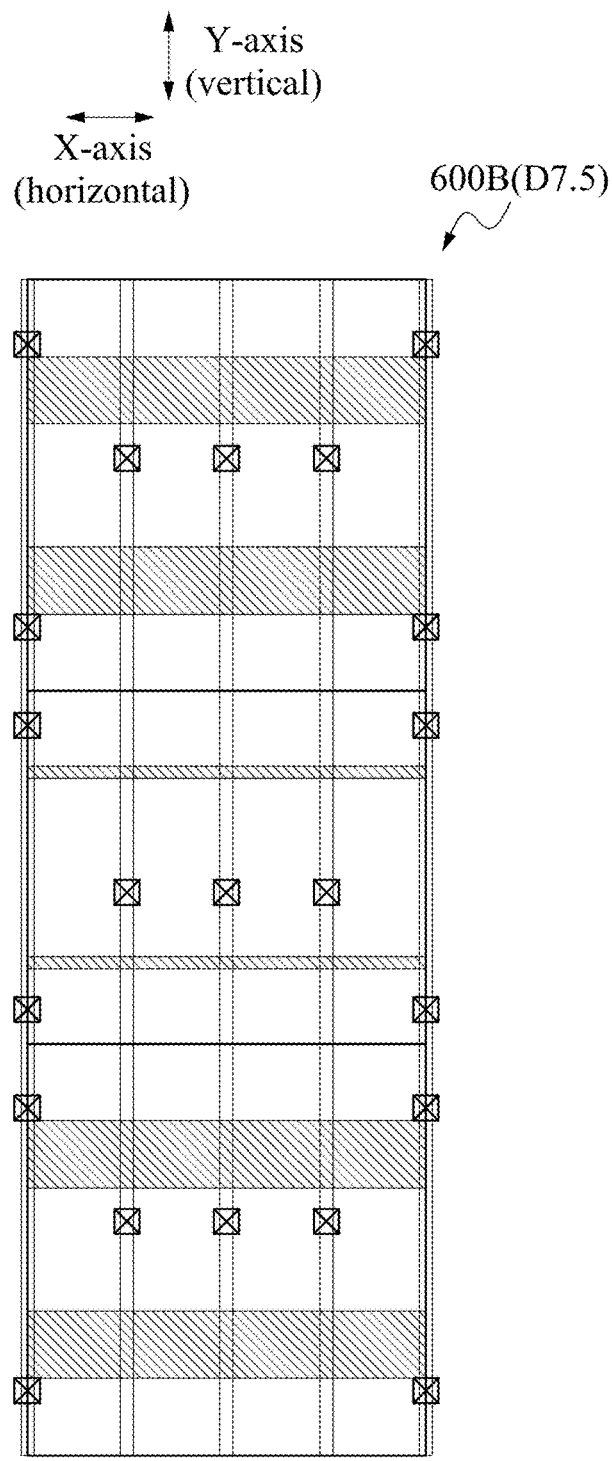
Figure 6C:
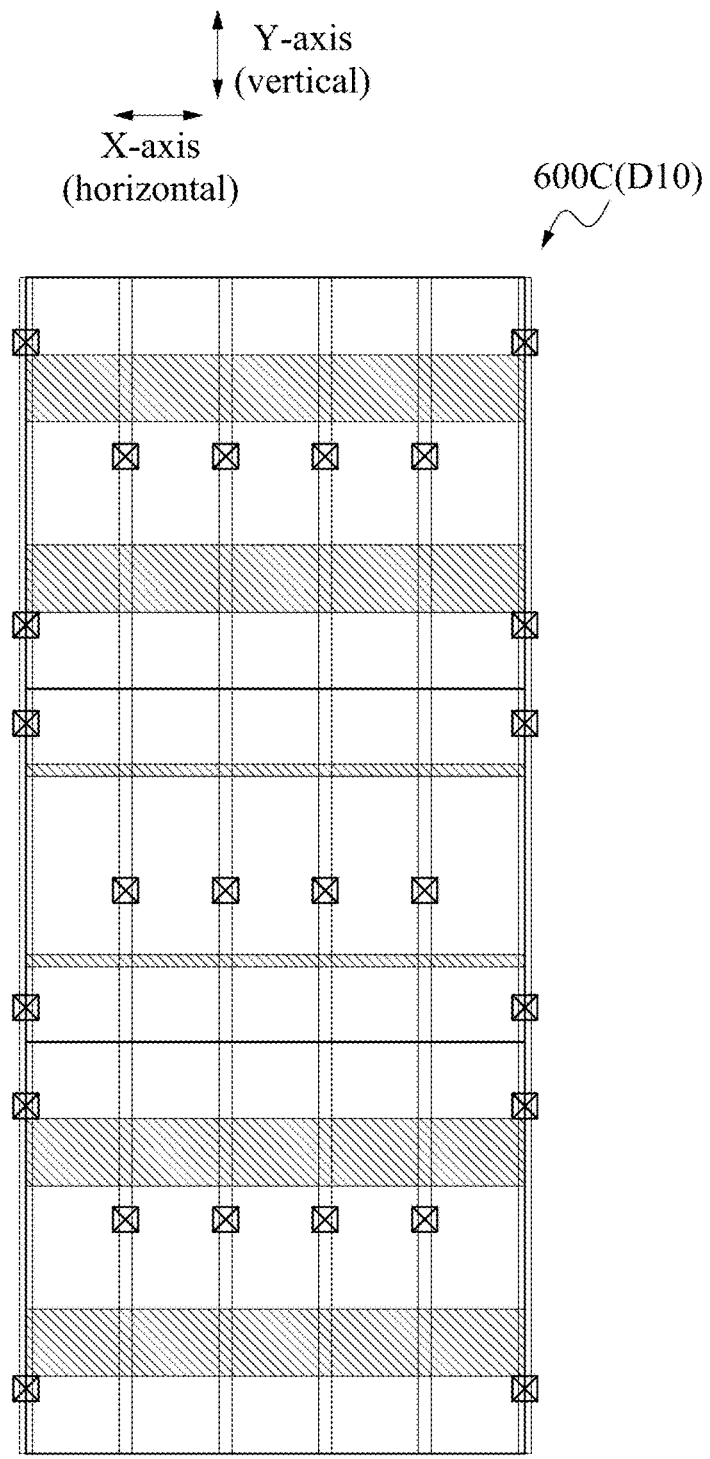

FIGS. 6A-6C are corresponding layout diagrams 600A(D5), 600B(D7.5) and 600C(D10) in accordance with some embodiments.

The examples discussed above have assumed the context of inverter cells. More particularly, the examples discussed above have assumed the substitution of inverter cells of height HA with corresponding multi-row-height inverter cells of various heights HC, HD and HE and corresponding various widths. As noted, layout diagram 300D(D2.5) of FIG. 3D shows in more detail an example of a multi-row inverter cell having height HD and a width of 2φCPP. FIGS. 6A-6C (discussed below) show, in more detail, examples of multi-row inverter cells of height HD that are wider than cell 304D and have correspondingly greater current driving capacity/capability. The inverters of FIGS. 6A-6C are substituted with corresponding inverter cells of height HA according to one or more of the refinement methods disclosed herein.

In FIG. 6A, layout diagram 600A(D5) is similar to layout diagram 300D(D2.5) of FIG. 3D. For brevity, the discussion will focus more on differences between layout diagram 600A(D5) and layout diagram 300D(D2.5) than on similarities.

In FIG. 6A, layout diagram 600A(D5) shows one cell that is an INVD5 type of inverter cell, which is reflected in the parenthetical D5 in reference number 600A(D5). Like cell 304D, the cell in layout diagram 600A(D5) includes three gate patterns, but further includes one additional gate pattern for a total of four gate patterns, which results in the greater current driving capacity/capability of the cell of layout diagram 600A(D5) as compared to cell 304D.

In FIG. 6B, layout diagram 600B(D7.5) is similar to layout diagram 600A(D5) of FIG. 6A. For brevity, the discussion will focus more on differences between layout diagram 600B(D7.5) and 600A(D5) than on similarities.

In FIG. 6B, layout diagram 600B(D7.5) shows one cell that is an INVD7.5 type of inverter cell, which is reflected in the parenthetical D7.5 in reference number 600B(D7.5). Like cell in layout diagram 600A(D5), the cell in layout diagram 600B(D7.5) includes four gate patterns, but further includes one additional gate pattern for a total of five gate patterns, which results in the greater current driving capacity/capability of the cell of layout diagram 600B(D7.5) as compared to the cell of layout diagram 600A(D5).

In FIG. 6C, layout diagram 600C(D10) is similar to layout diagram 600B(D7.5) of FIG. 6C. For brevity, the discussion will focus more on differences between layout diagram 600C(D10) and 600B(D7.5) than on similarities.

In FIG. 6C, layout diagram 600C(D10) shows one cell that is an INVD10 type of inverter cell, which is reflected in the parenthetical D10 in reference number 600C(D10). Like cell in layout diagram 600B(D7.5), the cell in layout diagram 600C(D10) includes five gate patterns, but further includes one additional gate pattern for a total of six gate patterns, which results in the greater current driving capacity/capability of the cell of layout diagram 600C(D10) as compared to the cell of layout diagram 600B(D7.5).

Figure 7:
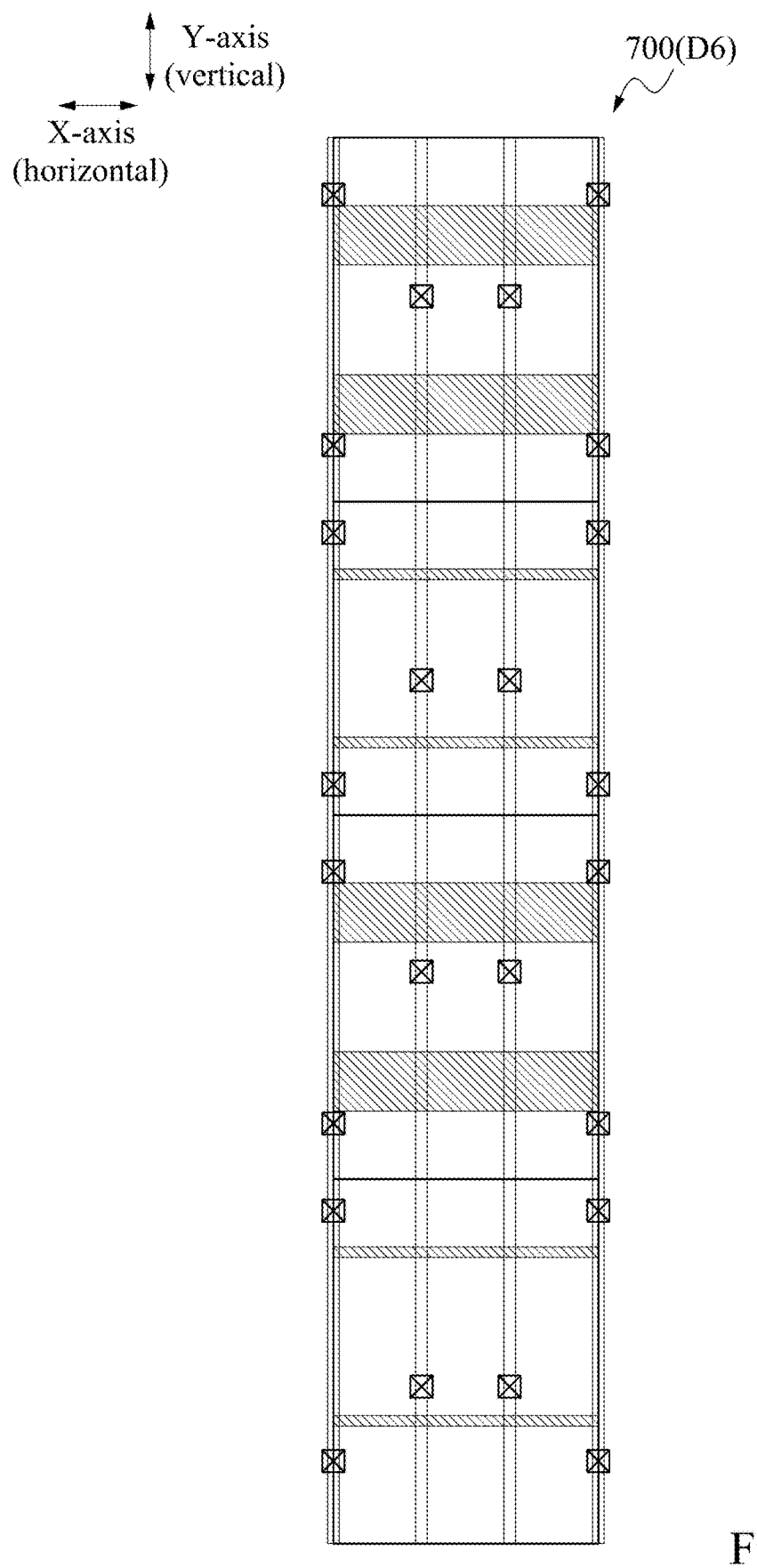
FIG. 7 is a layout diagram, in accordance with some embodiments.

The examples discussed above have assumed the context of inverter cells. More particularly, the examples discussed above have assumed the substitution of inverter cells of height HA with corresponding multi-row-height inverter cells of various heights HC, HD and HE and corresponding various widths. As noted, layout diagram 300E(D3) of FIG. 3E shows in more detail an example of a multi-row inverter cell having height HE and a width of 2φCPP. FIG. 7 (discussed below) shows, in more detail, an example of a multi-row inverter cell of height HE that is wider than cell 304E and has a correspondingly greater current driving capacity/capability. The inverter of FIG. 7 is substituted with a corresponding inverter cell of height HA according to one or more of the refinement methods disclosed herein.

FIG. 7 is a layout diagram 700(D6), in accordance with some embodiments.

In FIG. 7, layout diagram 700(D6) is similar to layout diagram 300E(D3) of FIG. 3E. For brevity, the discussion will focus more on differences between layout diagram 700(D6) and layout diagram 300E(D3) than on similarities.

In FIG. 7, layout diagram 700(D6) shows one cell that is an INVD6 type of inverter cell, which is reflected in the parenthetical D6 in reference number 700(D6). Like cell 304E. the cell in layout diagram 700(D6) includes three gate patterns, but further includes one additional gate pattern for a total of four gate patterns, which results in the greater current driving capacity/capability of the cell of layout diagram 700(D6) as compared to cell 304E.

Figure 8:
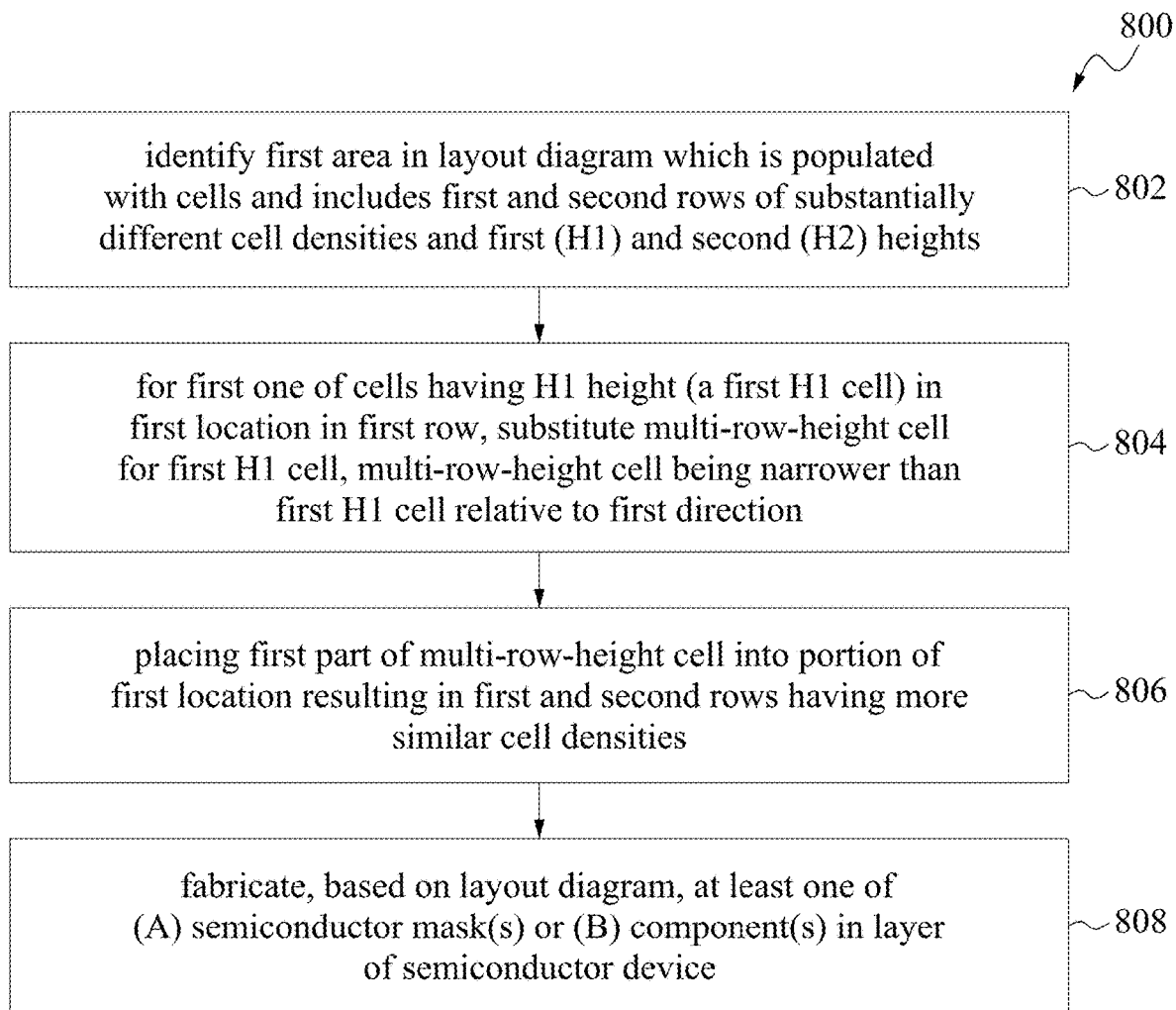
FIG. 8 is a flowchart of a method of generating a layout diagram, in accordance with one or more embodiments.

FIG. 8 is a flowchart of a method 800 of generating a layout diagram, in accordance with one or more embodiments.

Examples of layout diagrams which can be generated according to method 800 include the layout diagrams disclosed herein, or the like. In some embodiments, the layout diagram and versions thereof are stored on a non-transitory computer-readable medium, e.g., computer-readable medium 1004 in FIG. 10 (discussed below). Method 800 is implementable, for example, using EDA system 1000 (FIG. 10, discussed below), in accordance with some embodiments.

In FIG. 8, method 800 includes blocks 802-808. At block 802, a first area in a layout diagram is identified, the layout diagram being is populated with cells. The first area includes first and second rows extending substantially parallel to a first direction. The first and second rows have substantially different cell densities. In some embodiments, the identifying includes recognizing that the first row is substantially filled with corresponding ones of the cells, and recognizing that the second row is substantially devoid of corresponding ones of the cells. Relative to a second direction which is substantially perpendicular to the first direction, the first and second rows have corresponding first (H1) and second (H2) heights. An example of the first area is area 204 in layout diagram 200C of FIG. 2A. Examples of the first and second rows are corresponding rows R(i) and R(i+1) in FIG. 2C. Examples of the first and second directions correspondingly are the horizontal and vertical directions. Examples of the first and second rows having substantially different cell densities are shown in FIGS. 2C and 2F, or the like. Examples of the first and second heights correspondingly of the first and second rows are corresponding heights HA and HB, where HB is less than HA. In some embodiments, the multi-row-height cell has a height HC=HA+HB. From block 802, flow proceeds to block 804.

At block 804, for a first one of the cells having H1 height (a first H1 cell) in a first location in the first row, a multi-row-height cell is substituted for the first H1 cell (cell 212C). The multi-row-height cell is narrower than the first H1 cell relative to the first direction. An example of the first H1 cell is cell 212C in FIGS. 2C and 2E. Examples of the multi-row-height cells substituted for the first H1 cell include cells 212D in FIG. 2D, cells 212D', 216E and 218E in FIG. 2E, or the like. From block 804, flow proceeds to block 806.

At block 806, a first part of the multi-row-height cell is placed into a first portion of the first location resulting in the first and second rows having more similar cell densities. An example of the multi-row-height cell being placed into a first portion of the first location is the placement of cell 212D in FIG. 2D, which results in rows R(i) and R(i+1) of FIG. 2D having more similar cell densities. In terms of a larger number of substitutions and corresponding placements, an example of the first and second rows having more similar cell densities is provided by FIG. 2G. In some embodiments, the substituting and the placing, in effect: decrease a cell density of the first row; increase a cell density of the second row; and increase a combined cell density of the first and second rows. From block 806, flow proceeds to block 808.

In some embodiments, a second part of the multi-row cell additionally is disposed into a corresponding second location in the second row, the second location abutting the first location relative to the second direction. And a third part of the multi-row cell additionally is disposed into a corresponding third location in a third row, the third location abutting the second location relative to the second direction.

At block 808, based on the layout diagram, at least one of (A) one or more semiconductor masks or (B) at least one component in a layer of a semiconductor device is fabricated. See discussion below of FIG. 11. In some embodiments, the fabricating further includes performing one or more lithographic exposures based on the revised layout diagram.

Figure 9:
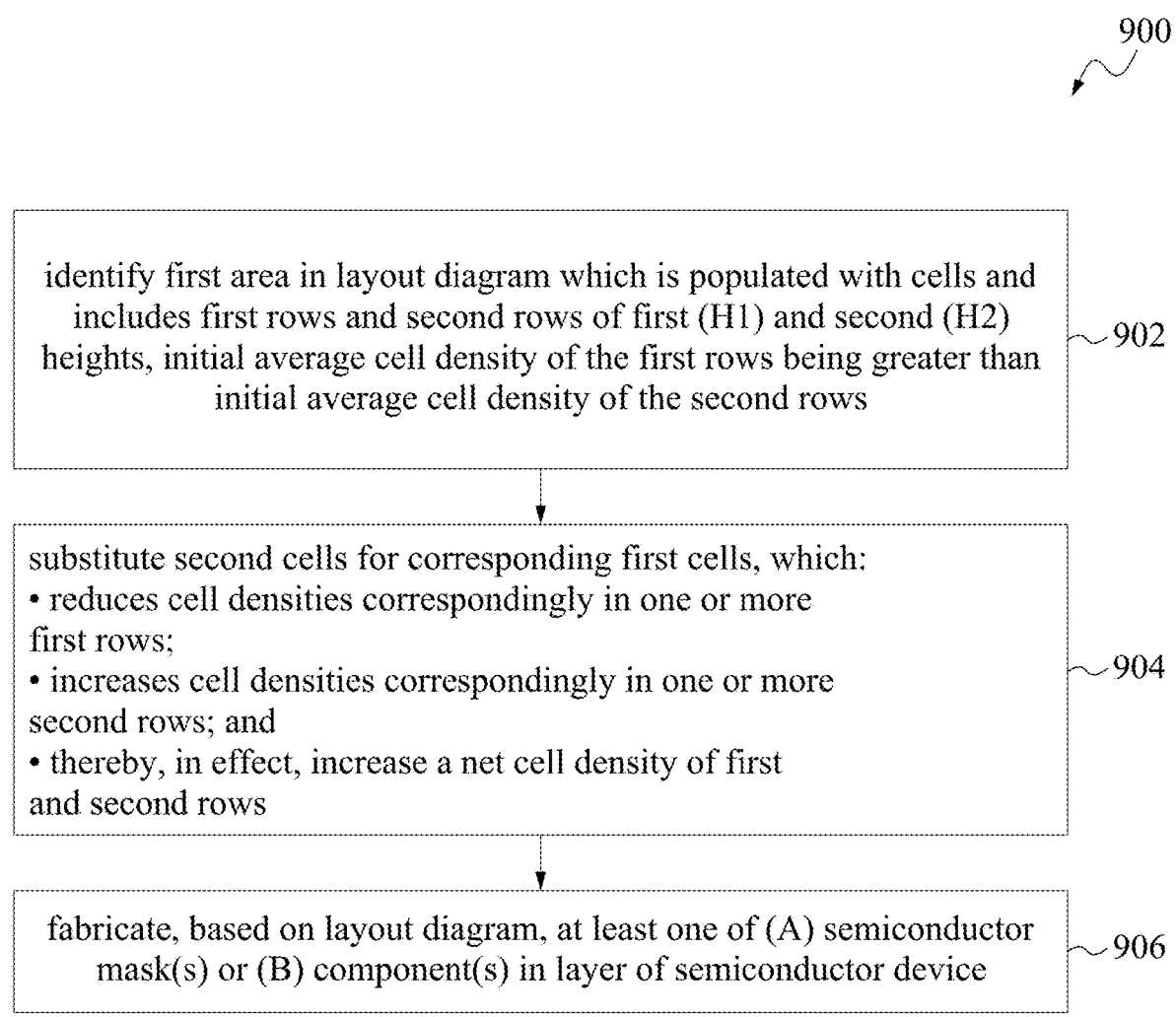
FIG. 9 is a flowchart of a method of generating a layout diagram, in accordance with one or more embodiments.

FIG. 9 is a flowchart of a method 900 of generating a layout diagram, in accordance with one or more embodiments.

Examples of layout diagrams which can be generated according to method 900 include the layout diagrams disclosed herein, or the like. In some embodiments, the layout diagram and versions thereof are stored on a non-transitory computer-readable medium, e.g., computer-readable medium 1004 in FIG. 10 (discussed below). Method 900 is implementable, for example, using EDA system 1000 (FIG. 10, discussed below), in accordance with some embodiments.

In FIG. 9, method 900 includes blocks 902-906. At block 902, a first area in a layout diagram is identified, the layout diagram being is populated with cells. The first area includes alternating first and second rows extending substantially parallel to a first direction. The first rows have a first height. The second rows have a second height different than the first height. An initial average cell density of the first rows is greater than an initial average cell density of the second rows. In some embodiments, the identifying includes recognizing that the first row is substantially filled with corresponding ones of the cells, and recognizing that the second row is substantially devoid of corresponding ones of the cells. An example of the first area is area 204 in layout diagram 200C of FIG. 2A. Examples of the first and second rows are corresponding rows R(i) and R(i+1) in FIG. 2C. Examples of the first and second directions correspondingly are the horizontal and vertical directions. Examples of the first and second rows having substantially different cell densities are shown in FIGS. 2C and 2F, or the like. Examples of the first and second heights correspondingly of the first and second rows are corresponding heights HA and HB, where HB is less than HA. An example of the initial average cell density of the first rows being greater than an initial average cell density of the second rows is shown in FIG. 2F. From block 902, flow proceeds to block 904.

At block 904, second cells are substituted for corresponding first cells in the corresponding first rows which: decreases cell densities of the first rows; increases cell densities of the second rows; and increases a net cell density of the first and the second rows.

Examples of the first cells are cells 212C in FIGS. 2C and 2E, and cells 210C and 214C in FIG. 2C, or the like. In some embodiments, the substituting includes: configuring the second cells to be narrower in the first direction than the corresponding first cells; and configuring the second cells to be taller in the second direction than the first row. Examples of the second cells substituted for the first cells include cells 212D in FIG. 2D, cells 212D', 216E and 218E in FIG. 2E, or the like. In some embodiments, a majority of the cells span, relative to the second direction, a single row; a minority of the cells span, relative to the second direction, multiple rows; and over half of the first area is populated with cells. From block 904, flow proceeds to block 906.

At block 906, based on the layout diagram, at least one of (A) one or more semiconductor masks or (B) at least one component in a layer of a semiconductor device is fabricated. See discussion below of FIG. 11. In some embodiments, the fabricating further includes performing one or more lithographic exposures based on the revised layout diagram.

Figure 10:
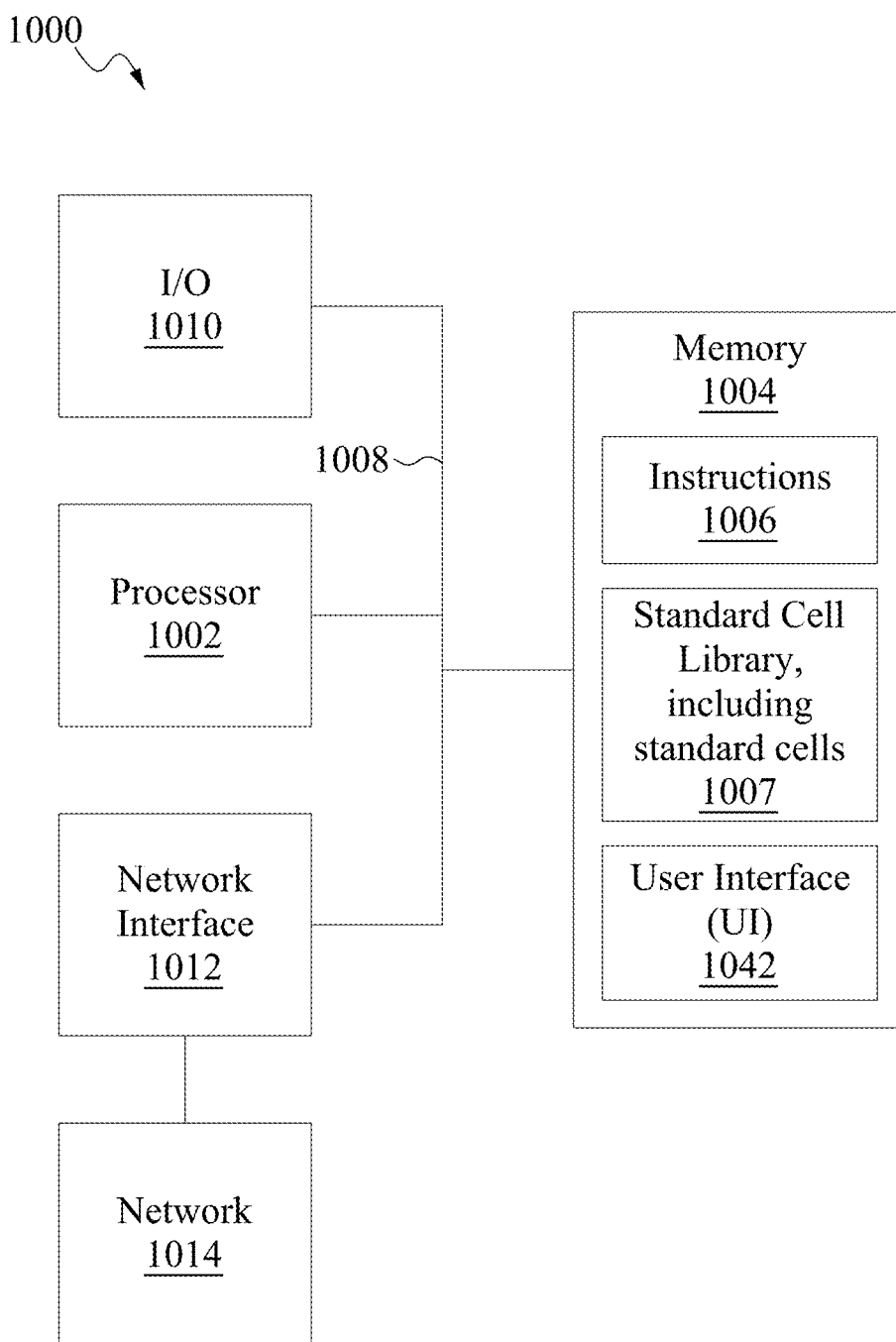
FIG. 10 is a block diagram of an electronic design automation (EDA) system, in accordance with some embodiments.

FIG. 10 is a block diagram of an electronic design automation (EDA) system 1000, in accordance with some embodiments.

In some embodiments, EDA system 900 includes an APR system. Methods described herein of revising layout diagrams, in accordance with one or more embodiments, are implementable, for example, using EDA system 1000, in accordance with some embodiments.

In some embodiments, EDA system 1000 is a general purpose computing device including a hardware processor 1002 and a non-transitory, computer-readable storage medium 1004. Storage medium 1004, amongst other things, is encoded with, i.e., stores, computer program code 1006, i.e., a set of executable instructions. Execution of instructions 1006 by hardware processor 1002 represents (at least in part) an EDA tool which implements a portion or all of, e.g., the methods described herein in accordance with one or more (hereinafter, the noted processes and/or methods).

Processor 1002 is electrically coupled to computer-readable storage medium 1004 via a bus 1008. Processor 1002 is also electrically coupled to an I/O interface 1010 by bus 1008. A network interface 1012 is also electrically connected to processor 1002 via bus 1008. Network interface 1012 is connected to a network 1014, so that processor 1002 and computer-readable storage medium 1004 are capable of connecting to external elements via network 1014. Processor 1002 is configured to execute computer program code 1006 encoded in computer-readable storage medium 1004 in order to cause system 1000 to be usable for performing a portion or all of the noted processes and/or methods. In one or more embodiments, processor 1002 is a central processing unit (CPU), a multi-processor, a distributed processing system, an application specific integrated circuit (ASIC), and/or a suitable processing unit.

In one or more embodiments, computer-readable storage medium 1004 is an electronic, magnetic, optical, electromagnetic, infrared, and/or a semiconductor system (or apparatus or device). For example, computer-readable storage medium 1004 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 1004 includes a compact disk-read only memory (CD-ROM), a compact disk-read/write (CD-R/W), and/or a digital video disc (DVD).

In one or more embodiments, storage medium 1004 stores computer program code 1006 configured to cause system 1000 (where such execution represents (at least in part) the EDA tool) to be usable for performing a portion or all of the noted processes and/or methods. In one or more embodiments, storage medium 1004 also stores information which facilitates performing a portion or all of the noted processes and/or methods. In one or more embodiments, storage medium 1004 stores library 1007 of standard cells including such standard cells as disclosed herein. In one or more embodiments, storage medium 1004 stores one or more layout diagrams 1009.

EDA system 1000 includes I/O interface 1010. I/O interface 1010 is coupled to external circuitry. In one or more embodiments, I/O interface 1010 includes a keyboard, keypad, mouse, trackball, trackpad, touchscreen, and/or cursor direction keys for communicating information and commands to processor 1002.

EDA system 1000 also includes network interface 1012 coupled to processor 1002. Network interface 1012 allows system 1000 to communicate with network 1014, to which one or more other computer systems are connected. Network interface 1012 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more systems 1000.

System 1000 is configured to receive information through I/O interface 1010. The information received through I/O interface 1010 includes one or more of instructions, data, design rules, libraries of standard cells, and/or other parameters for processing by processor 1002. The information is transferred to processor 1002 via bus 1008. EDA system 1000 is configured to receive information related to a UI through I/O interface 1010. The information is stored in computer-readable medium 1004 as user interface (UI) 1042.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 1000. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 11:
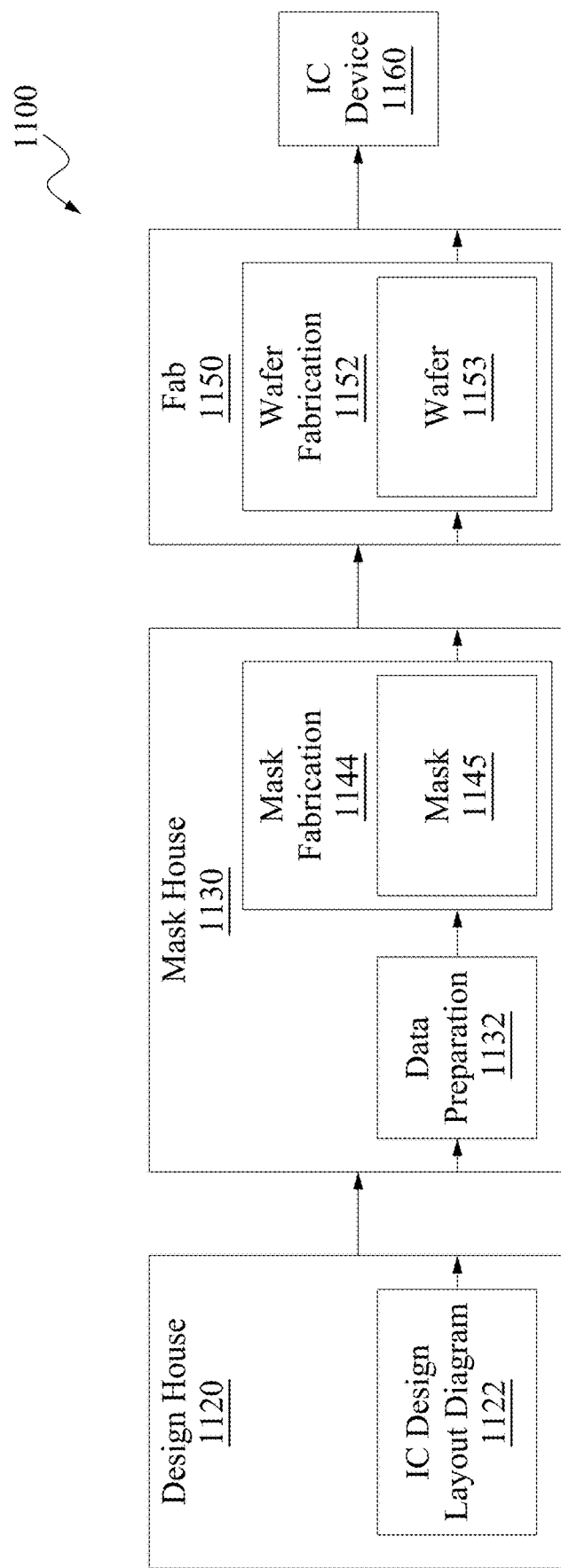
FIG. 11 is a block diagram of an integrated circuit (IC) manufacturing system, and an IC manufacturing flow associated therewith, in accordance with some embodiments.

FIG. 11 is a block diagram of an integrated circuit (IC) manufacturing system 1100, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using manufacturing system 1100.

In FIG. 11, IC manufacturing system 1100 includes entities, such as a design house 1120, a mask house 1130, and an IC manufacturer/fabricator ("fab") 1150, that interact with one another in the design, development, and manufacturing cycles and/or services related to manufacturing an IC device 1160. The entities in system 1100 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 1120, mask house 1130, and IC fab 1150 is owned by a single larger company. In some embodiments, two or more of design house 1120, mask house 1130, and IC fab 1150 coexist in a common facility and use common resources.

Design house (or design team) 1120 generates an IC design layout diagram 1122. IC design layout diagram 1122 includes various geometrical patterns designed for an IC device 1160. The geometrical patterns correspond to patterns of metal, oxide, or semiconductor layers that make up the various components of IC device 1160 to be fabricated. The various layers combine to form various IC features. For example, a portion of IC design layout diagram 1122 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 1120 implements a proper design procedure to form IC design layout diagram 1122. The design procedure includes one or more of logic design, physical design or place and route. IC design layout diagram 1122 is presented in one or more data files having information of the geometrical patterns. For example, IC design layout diagram 1122 can be expressed in a GDSII file format or DFII file format.

Mask house 1130 includes mask data preparation 1132 and mask fabrication 1144. Mask house 1130 uses IC design layout diagram 1122 to manufacture one or more masks 1145 to be used for fabricating the various layers of IC device 1160 according to IC design layout diagram 1122. Mask house 1130 performs mask data preparation 1132, where IC design layout diagram 1122 is translated into a representative data file ("RDF"). Mask data preparation 1132 provides the RDF to mask fabrication 1144. Mask fabrication 1144 includes a mask writer. A mask writer converts the RDF to an image on a substrate, such as a mask (reticle) 1145 or a semiconductor wafer 1153. The design layout diagram 1122 is manipulated by mask data preparation 1132 to comply with particular characteristics of the mask writer and/or requirements of IC fab 1150. In FIG. 11, mask data preparation 1132 and mask fabrication 1144 are illustrated as separate elements. In some embodiments, mask data preparation 1132 and mask fabrication 1144 can be collectively referred to as mask data preparation.

In some embodiments, mask data preparation 1132 includes optical proximity correction (OPC) which uses lithography enhancement techniques to compensate for image errors, such as those that can arise from diffraction, interference, other process effects and the like. OPC adjusts IC design layout diagram 1122. In some embodiments, mask data preparation 1132 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 1132 includes a mask rule checker (MRC) that checks the IC design layout diagram 1122 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 1122 to compensate for limitations during mask fabrication 1144, which may undo part of the modifications performed by OPC in order to meet mask creation rules.

In some embodiments, mask data preparation 1132 includes lithography process checking (LPC) that simulates processing that will be implemented by IC fab 1150 to fabricate IC device 1160. LPC simulates this processing based on IC design layout diagram 1122 to create a simulated manufactured device, such as IC device 1160. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 1122.

It should be understood that the above description of mask data preparation 1132 has been simplified for the purposes of clarity. In some embodiments, data preparation 1132 includes additional features such as a logic operation (LOP) to modify the IC design layout diagram 1122 according to manufacturing rules. Additionally, the processes applied to IC design layout diagram 1122 during data preparation 1132 may be executed in a variety of different orders.

After mask data preparation 1132 and during mask fabrication 1144, a mask 1145 or a group of masks 1145 are fabricated based on the modified IC design layout diagram 1122. In some embodiments, mask fabrication 1144 includes performing one or more lithographic exposures based on IC design layout diagram 1122. In some embodiments, an electron-beam (e-beam) or a mechanism of multiple e-beams is used to form a pattern on a mask (photomask or reticle) 1145 based on the modified IC design layout diagram 1122. Mask 1145 can be formed in various technologies. In some embodiments, mask 1145 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of mask 1145 includes a transparent substrate (e.g., fused quartz) and an opaque material (e.g., chromium) coated in the opaque regions of the binary mask. In another example, mask 1145 is formed using a phase shift technology. In a phase shift mask (PSM) version of mask 1145, various features in the pattern formed on the phase shift mask are configured to have proper phase difference to enhance the resolution and imaging quality. In various examples, the phase shift mask can be attenuated PSM or alternating PSM. The mask(s) generated by mask fabrication 1144 is used in a variety of processes. For example, such a mask(s) is used in an ion implantation process to form various doped regions in semiconductor wafer 1153, in an etching process to form various etching regions in semiconductor wafer 1153, and/or in other suitable processes.

IC fab 1150 includes wafer fabrication 1152. IC fab 1150 is an IC fabrication business that includes one or more manufacturing facilities for the fabrication of a variety of different IC products. In some embodiments, IC Fab 1150 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 1150 uses mask(s) 1145 fabricated by mask house 1130 to fabricate IC device 1160. Thus, IC fab 1150 at least indirectly uses IC design layout diagram 1122 to fabricate IC device 1160. In some embodiments, semiconductor wafer 1153 is fabricated by IC fab 1150 using mask(s) 1145 to form IC device 1160. In some embodiments, the IC fabrication includes performing one or more lithographic exposures based at least indirectly on IC design layout diagram 1122. Semiconductor wafer 1153 includes a silicon substrate or other proper substrate having material layers formed thereon. Semiconductor wafer 1153 further includes one or more of various doped regions, dielectric features, multilevel interconnects, and the like (formed at subsequent manufacturing steps).

Details regarding an integrated circuit (IC) manufacturing system (e.g., system 1100 of FIG. 11), and an IC manufacturing flow associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 20140040838, published Feb. 6, 2014, and U.S. Pat. No. 7,260,442, granted Aug. 21, 2007, the entireties of each of which are hereby incorporated by reference.

In some embodiments, a method (of forming a semiconductor device) includes forming cell regions in alternating first and second rows extending substantially parallel to a first direction, the first and second rows having corresponding first and second heights (relative to a second direction substantially perpendicular to the first direction), the forming cell regions including forming a majority of the cell regions correspondingly in the first rows, the forming a majority of the cell regions including: relative to the second direction, limiting a height of the majority of the cell regions to be single-row cell regions that span a corresponding single one of the first rows but do not extend therebeyond; and forming a minority of the cell regions correspondingly in at least the first rows, the forming a minority of the cell regions including expanding heights of the minority of the cell regions to be multi-row cell regions that correspondingly span multiple rows, each of the multi-row cell regions spanning a corresponding single one of the first rows and at least a corresponding one of the second rows such that cell region densities of the second rows are at least about forty percent.

In some embodiments, the expanding heights of the minority of the cell regions to be multi-row cell regions expands the heights of the multi-row cell regions sufficiently such that cell region densities of the second rows are at least in a range of $(\approx 40\%) \leq D\_2nd \leq (\approx =70\%)$.

In some embodiments, the forming a minority of the cell regions further includes configuring the multi-row cell regions to perform corresponding Boolean functions.

In some embodiments, the configuring the multi-row cell regions to perform corresponding Boolean functions includes configuring at least some of the multi-row cell regions as to perform Boolean inversion.

In some embodiments, the forming a majority of the cell regions further includes configuring at least some of the single-row cell regions to perform corresponding storage functions.

In some embodiments, the forming a minority of the cell regions further includes relative to the first direction, reducing widths of the multi-row cell regions to be smaller than comparable single-row cell regions.

In some embodiments, the comparable single-row cell regions are comparable in terms of current driving capability.

In some embodiments, relative to widths W_sr of comparable single-row cell regions, the reducing widths of the multi-row cell regions forms multi-row cell regions having corresponding widths W_mr in a range as follows:

$$\left(\approx\left(\frac{4*W\_sr}{9}\right)\right) \leq W\_mr \leq \left(\approx\left(\frac{4*W\_sr}{5}\right)\right).$$

In some embodiments, the expanding heights of the minority of the cell regions to be multi-row cell regions expands the heights of some of the multi-row cell regions to be at least triple height cell regions.

In some embodiments, the expanding heights of the minority of the cell regions to be multi-row cell regions expands the heights of some of the multi-row cell regions to be at least quadruple height cell regions.

In some embodiments, areas are defined in terms of the first and second directions, and the forming a minority of the cell regions further includes reducing areas of the multi-row cell regions relative to be smaller than areas of comparable single-row cell regions.

In some embodiments, relative to areas A_sr of comparable single-row cell regions, the reducing areas of the multi-row cell regions forms multi-row cell regions having corresponding areas A_mr in a range as follows:

($\approx 0.44 A\_sr) \leq A\_mr \leq (\approx 0.80 A\_sr)$.

In some embodiments, a height of the second rows is less than a height of the first rows.

In some embodiments, a method (of forming a semiconductor device) includes forming cell regions in alternating first and second rows extending substantially parallel to a first direction, the first and second rows having corresponding first and second heights (relative to a second direction substantially perpendicular to the first direction), the forming cell regions including forming a majority of the cell regions correspondingly in the first rows, the forming a majority of the cell regions including: relative to the second direction, limiting a height of the majority of the cell regions to be single-row cell regions that span a corresponding single one of the first rows but do not extend therebeyond; and forming a minority of the cell regions correspondingly in at least the first rows, the forming a minority of the cell regions including: relative to the first direction, reducing widths of the multi-row cell regions to be smaller than comparable single-row cell regions; and expanding heights of the minority of the cell regions to be multi-row cell regions that correspondingly span multiple rows, each of the multi-row cell regions spanning a corresponding single one of the first rows and at least a corresponding one of the second rows such that cell region densities of the second rows are at least about forty percent.

In an embodiment, relative to widths W_sr of comparable single-row cell regions, the reducing widths of the multi-row cell regions forms multi-row cell regions having corresponding widths W_mr in a range as follows:

$$\left(\approx\left(\frac{4*W\_sr}{9}\right)\right) \leq W\_mr \leq \left(\approx\left(\frac{4*W\_sr}{5}\right)\right).$$

In an embodiment, the expanding heights of the minority of the cell regions to be multi-row cell regions expands the heights of some of the multi-row cell regions to be at least triple height cell regions.

In an embodiment, the expanding heights of the minority of the cell regions to be multi-row cell regions expands the heights of some of the multi-row cell regions to be at least quadruple height cell regions.

In an embodiment, the forming a minority of the cell regions further includes configuring the multi-row cell regions to perform corresponding Boolean functions.

In an embodiment, a method (of forming a semiconductor device) includes forming cell regions in alternating first and second rows extending substantially parallel to a first direction, the first and second rows having corresponding first and second heights (relative to a second direction substantially perpendicular to the first direction), the forming cell regions including forming a majority of the cell regions correspondingly in the first rows, the forming a majority of the cell regions including: relative to the second direction, limiting a height of the majority of the cell regions to be single-row cell regions that span a corresponding single one of the first rows but do not extend therebeyond; and forming a minority of the cell regions correspondingly in at least the first rows, the forming a minority of the cell regions including: expanding heights of the minority of the cell regions to be multi-row cell regions that correspondingly span multiple rows, each of the multi-row cell regions spanning a corresponding single one of the first rows and at least a corresponding one of the second rows such that cell region densities of the second rows are at least about forty percent; and for a context in which areas are defined in terms of the first and second directions, reducing areas of the multi-row cell regions relative to be smaller than areas of comparable single-row cell regions.

In some embodiments, relative to areas A_sr of comparable single-row cell regions, the reducing areas of the multi-row cell regions forms multi-row cell regions having corresponding areas A_mr in a range as follows:

($\approx 0.44 A\_sr) \leq A\_mr \leq (\approx 0.80 A\_sr)$.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, the method comprising:
forming cell regions in alternating first and second rows extending substantially parallel to a first direction;

relative to a second direction substantially perpendicular to the first direction, the first and second rows having corresponding first and second heights;

the forming cell regions including:

forming a majority of the cell regions correspondingly in the first rows, the forming a majority of the cell regions including:

relative to the second direction, limiting a height of the majority of the cell regions to be single-row cell regions that span a corresponding single one of the first rows but do not extend therebeyond; and forming a minority of the cell regions correspondingly in at least the first rows, the forming a minority of the cell regions including:

expanding heights of the minority of the cell regions to be multi-row cell regions that correspondingly span multiple rows, each of the multi-row cell regions spanning a corresponding single one of the first rows and at least a corresponding one of the second rows such that cell region densities of the second rows are at least about forty percent.

2. The method of claim 1, wherein:
the expanding heights of the minority of the cell regions to be multi-row cell regions expands the heights of the multi-row cell regions sufficiently such that cell region densities of the second rows are at least in a range of $(\approx 40\%) \leq D\_2nd \leq (\approx=70\%)$.

3. The method of claim 1, wherein the forming a minority of the cell regions further includes:
configuring the multi-row cell regions to perform corresponding Boolean functions.

4. The method of claim 3, wherein the configuring the multi-row cell regions to perform corresponding Boolean functions includes:
configuring at least some of the multi-row cell regions as to perform Boolean inversion.

5. The method of claim 1, wherein the forming a majority of the cell regions further includes:
configuring at least some of the single-row cell regions to perform corresponding storage functions.

6. The method of claim 1, wherein the forming a minority of the cell regions further includes:
relative to the first direction, reducing widths of the multi-row cell regions to be smaller than comparable single-row cell regions.

7. The method of claim 6, wherein:
the comparable single-row cell regions are comparable in terms of current driving capability.

8. The method of claim 6, wherein:
relative to widths W_sr of comparable single-row cell regions, the reducing widths of the multi-row cell regions forms multi-row cell regions having corresponding widths W_mr in a range as follows:

$$\left(\approx\left(\frac{4*W\_sr}{9}\right)\right) \leq W\_mr \leq \left(\approx\left(\frac{4*W\_sr}{5}\right)\right).$$

9. The method of claim 1, wherein:
the expanding heights of the minority of the cell regions to be multi-row cell regions expands the heights of some of the multi-row cell regions to be at least triple height cell regions.

10. The method of claim 9, wherein:
the expanding heights of the minority of the cell regions to be multi-row cell regions expands the heights of some of the multi-row cell regions to be at least quadruple height cell regions.

11. The method of claim 1, wherein:
areas are defined in terms of the first and second directions; and
the forming a minority of the cell regions further includes:
reducing areas of the multi-row cell regions relative to be smaller than areas of comparable single-row cell regions.

12. The method of claim 11, wherein:
relative to areas A_sr of comparable single-row cell regions, the reducing areas of the multi-row cell regions forms multi-row cell regions having corresponding areas A_mr in a range as follows:

$$(\approx 0.44A\_sr) \leq A\_mr \leq (\approx 0.80A\_sr).$$

13. The method of claim 1, wherein:
a height of the second rows is less than a height of the first rows.

14. A method of forming a semiconductor device, the method comprising:
forming cell regions in alternating first and second rows extending substantially parallel to a first direction;
relative to a second direction substantially perpendicular to the first direction, the first and second rows having corresponding first and second heights;
the forming cell regions including:
forming a majority of the cell regions correspondingly in the first rows, the forming a majority of the cell regions including:
relative to the second direction, limiting a height of the majority of the cell regions to be single-row cell regions that span a corresponding single one of the first rows but do not extend therebeyond; and
forming a minority of the cell regions correspondingly in at least the first rows, the forming a minority of the cell regions including:
expanding heights of the minority of the cell regions to be multi-row cell regions that correspondingly span multiple rows, each of the multi-row cell regions spanning a corresponding single one of the first rows and at least a corresponding one of the second rows such that cell region densities of the second rows are at least about forty percent; and
relative to the first direction, reducing widths of the multi-row cell regions to be smaller than comparable single-row cell regions.

15. The method of claim 14, wherein:
relative to widths W_sr of comparable single-row cell regions, the reducing widths of the multi-row cell regions forms multi-row cell regions having corresponding widths W_mr in a range as follows:

$$\left(\approx\left(\frac{4*W\_sr}{9}\right)\right) \leq W\_mr \leq \left(\approx\left(\frac{4*W\_sr}{5}\right)\right).$$

16. The method of claim 14, wherein:
the expanding heights of the minority of the cell regions to be multi-row cell regions expands the heights of some of the multi-row cell regions to be at least triple height cell regions.

17. The method of claim 16, wherein:
the expanding heights of the minority of the cell regions to be multi-row cell regions expands the heights of some of the multi-row cell regions to be at least quadruple height cell regions.

18. The method of claim 14, wherein the forming a minority of the cell regions further includes:
configuring the multi-row cell regions to perform corresponding Boolean functions.

19. A method of forming a semiconductor device, the method comprising:
forming cell regions in alternating first and second rows extending substantially parallel to a first direction;
relative to a second direction substantially perpendicular to the first direction, the first and second rows having corresponding first and second heights;
the forming cell regions including:
forming a majority of the cell regions correspondingly in the first rows, the forming a majority of the cell regions including:
relative to the second direction, limiting a height of the majority of the cell regions to be single-row cell regions that span a corresponding single one of the first rows but do not extend therebeyond; and
forming a minority of the cell regions correspondingly in at least the first rows, the forming a minority of the cell regions including:
expanding heights of the minority of the cell regions to be multi-row cell regions that correspondingly span multiple rows, each of the multi-row cell regions spanning a corresponding single one of the first rows and at least a corresponding one of the second rows such that cell region densities of the second rows are at least about forty percent; and
for a context in which areas are defined in terms of the first and second directions, reducing areas of the multi-row cell regions relative to be smaller than areas of comparable single-row cell regions.

20. The method of claim 19, wherein:
relative to areas $A\_sr$ of comparable single-row cell regions, the reducing areas of the multi-row cell regions forms multi-row cell regions having corresponding areas $A\_mr$ in a range as follows:

$$(\approx 0.44 A\_sr) \leq A\_mr \leq (\approx 0.80 A\_sr).$$

* * * * *